US012575050B2

(12) United States Patent
Mundt et al.

(10) Patent No.: US 12,575,050 B2
(45) Date of Patent: Mar. 10, 2026

(54) MULTI-DEVICE RACK WIDTH ADAPTER SYSTEM

(71) Applicant: Dell Products L.P., Round Rock, TX (US)

(72) Inventors: Kevin Warren Mundt, Austin, TX (US); Richard Andrew Crisp, Austin, TX (US); Parth Patel, Austin, TX (US); Peter Kaltenbach, Austin, TX (US); Elizabeth Ruchte, Austin, TX (US)

(73) Assignee: Dell Products L.P., Round Rock, TX (US)

( * ) Notice: Subject to any disclaimer, the term of this patent is extended or adjusted under 35 U.S.C. 154(b) by 168 days.

(21) Appl. No.: 18/411,885

(22) Filed: Jan. 12, 2024

(65) Prior Publication Data

US 2025/0234475 A1     Jul. 17, 2025

(51) Int. Cl.
*H05K 7/14* (2006.01)
(52) U.S. Cl.
CPC .................................. H05K 7/1489 (2013.01)
(58) Field of Classification Search
None
See application file for complete search history.

(56) References Cited

U.S. PATENT DOCUMENTS

| | | |
|---|---|---|
| 11,044,827 B2 | 6/2021 | White et al. |
| 11,744,034 B2 * | 8/2023 | Klaba .................... H05K 7/183 |
| | | 361/725 |
| 2010/0243586 A1 * | 9/2010 | Henderson ........... H05K 7/1489 |
| | | 248/220.21 |
| 2024/0114644 A1 * | 4/2024 | Gruppo ................ H05K 7/1404 |
| 2024/0224458 A1 * | 7/2024 | Norton ................... H05K 7/186 |

* cited by examiner

*Primary Examiner* — Xanthia C Relford
(74) *Attorney, Agent, or Firm* — Joseph Mencher

(57) ABSTRACT

A multi-device rack-width-adapted rack system includes a multi-device rack width adapter system mounted to a rack having first and second sides defining a rack housing having a first housing width. The multi-device rack width adapter system includes a first multi-device rack width adapter subsystem in the rack housing mounted to the first side of the rack, a second multi-device rack width adapter subsystem in the rack housing mounted to the second side of the rack, and pairs of device coupling elements each including a first device coupling element on the first multi-device rack width adapter subsystem and a second device coupling element on the second multi-device rack width adapter subsystem. Each pair of device coupling elements may couple a second device to the rack in a second device housing defined by that pair of device coupling elements with a second housing width that is smaller than the first housing width.

20 Claims, 20 Drawing Sheets

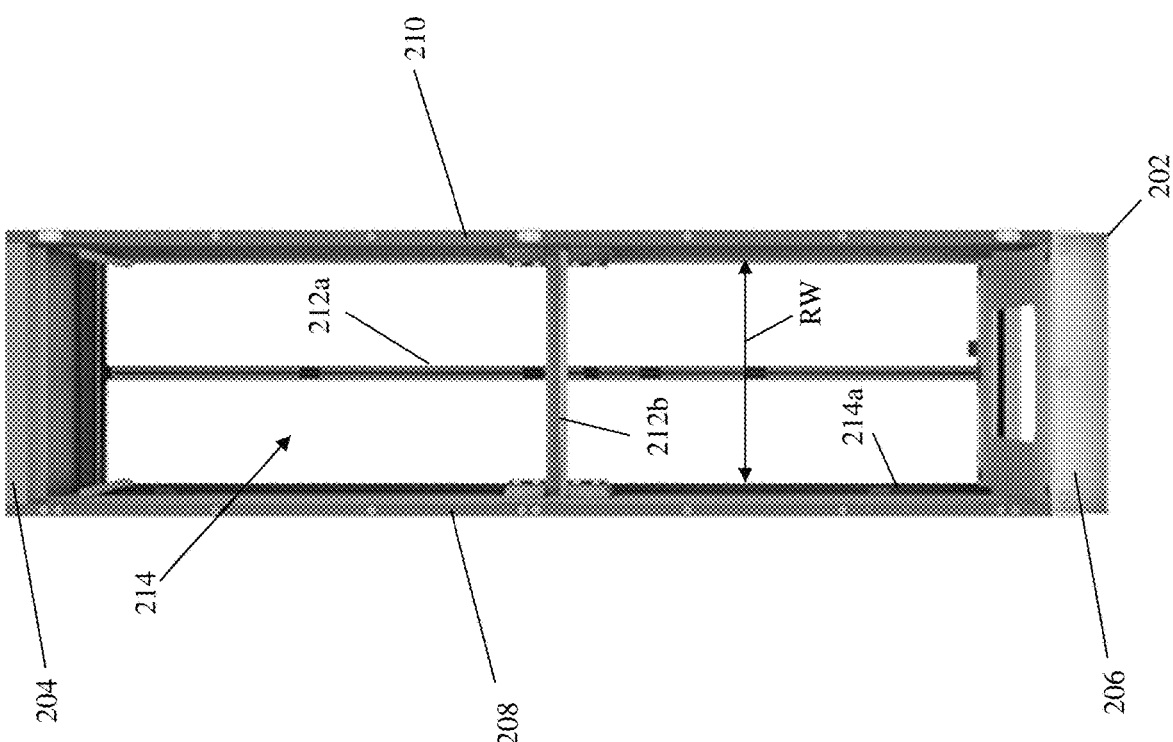
FIG. 2A

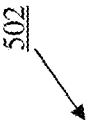
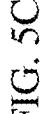
FIG. 5C

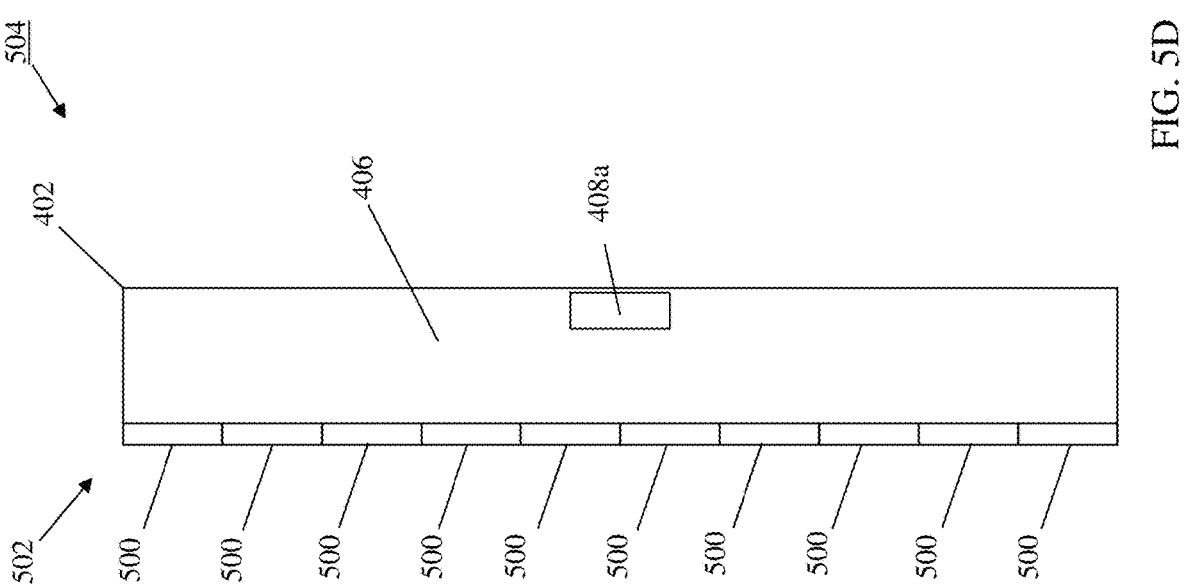
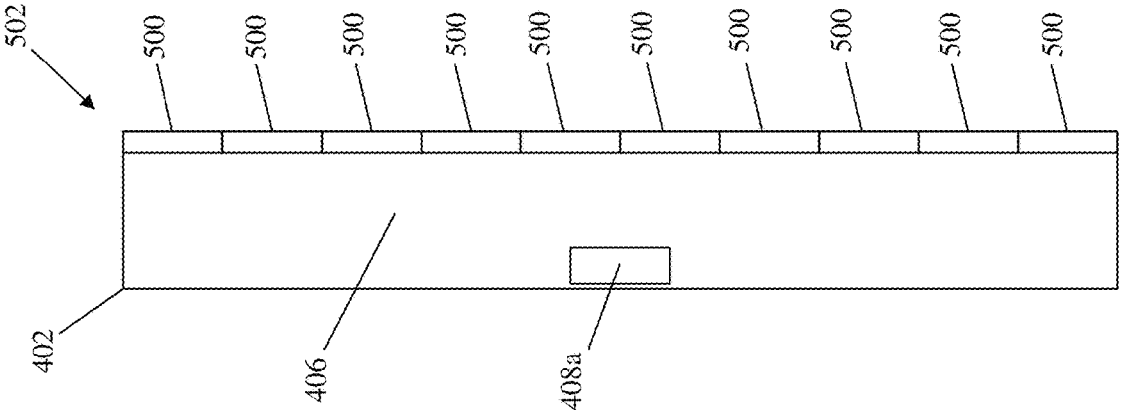
FIG. 5D

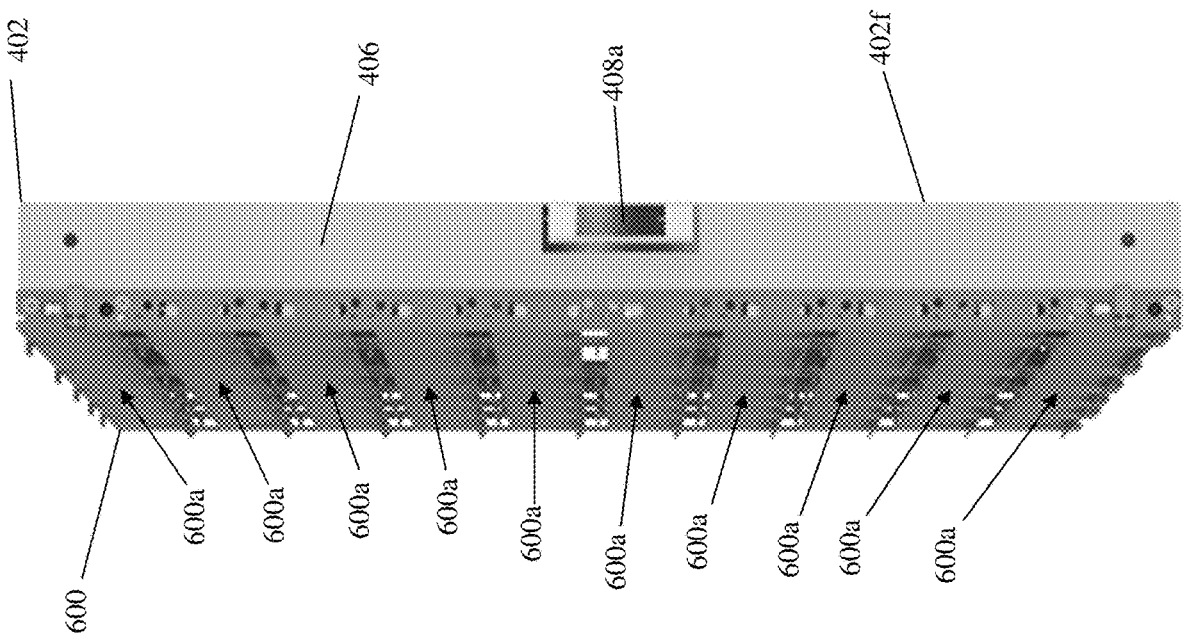
FIG. 6

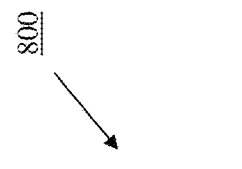

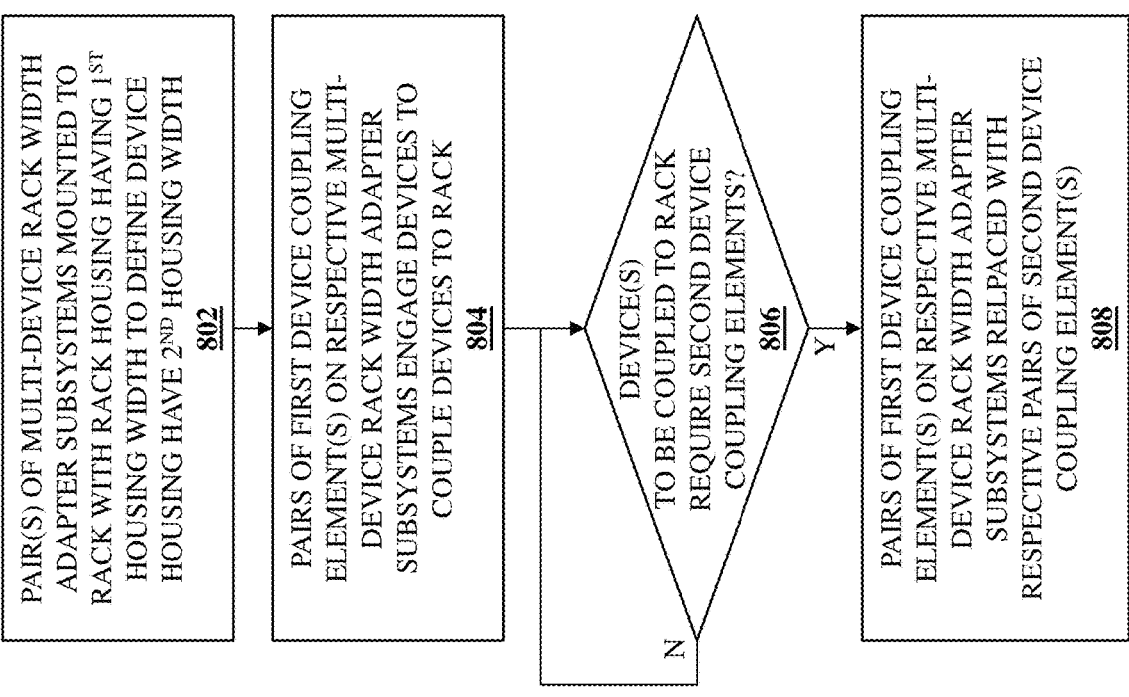

PAIR(S) OF MULTI-DEVICE RACK WIDTH ADAPTER SUBSYSTEMS MOUNTED TO RACK WITH RACK HOUSING HAVING $1^{ST}$ HOUSING WIDTH TO DEFINE DEVICE HOUSING HAVE $2^{ND}$ HOUSING WIDTH
802

PAIRS OF FIRST DEVICE COUPLING ELEMENT(S) ON RESPECTIVE MULTI-DEVICE RACK WIDTH ADAPTER SUBSYSTEMS ENGAGE DEVICES TO COUPLE DEVICES TO RACK
804

DEVICE(S) TO BE COUPLED TO RACK REQUIRE SECOND DEVICE COUPLING ELEMENTS?
806

N

Y

PAIRS OF FIRST DEVICE COUPLING ELEMENT(S) ON RESPECTIVE MULTI-DEVICE RACK WIDTH ADAPTER SUBSYSTEMS RELPACED WITH RESPECTIVE PAIRS OF SECOND DEVICE COUPLING ELEMENT(S)
808

FIG. 8

MULTI-DEVICE RACK WIDTH ADAPTER SYSTEM

CROSS-REFERENCE TO RELATED APPLICATIONS

The present disclosure is related to the following co-pending applications: 1) U.S. patent application Ser. No. 18/411,262, filed Jan. 12, 2024; and 2) U.S. patent application Ser. No. 18/411,470, filed Jan. 12, 2024.

BACKGROUND

The present disclosure relates generally to information handling systems, and more particularly to adapting a width of a rack to house multiple information handling systems.

As the value and use of information continues to increase, individuals and businesses seek additional ways to process and store information. One option available to users is information handling systems. An information handling system generally processes, compiles, stores, and/or communicates information or data for business, personal, or other purposes thereby allowing users to take advantage of the value of the information. Because technology and information handling needs and requirements vary between different users or applications, information handling systems may also vary regarding what information is handled, how the information is handled, how much information is processed, stored, or communicated, and how quickly and efficiently the information may be processed, stored, or communicated. The variations in information handling systems allow for information handling systems to be general or configured for a specific user or specific use such as financial transaction processing, airline reservations, enterprise data storage, or global communications. In addition, information handling systems may include a variety of hardware and software components that may be configured to process, store, and communicate information and may include one or more computer systems, data storage systems, and networking systems.

Information handling systems such as, for example, server devices, networking devices (e.g., switch devices), and/or storage systems are sometimes housed in racks. Conventional racks such as Electronic Industries Alliance 310 D (EIA-310-D) racks have been provided with a 19-inch width for housing "19-inch" server devices, networking devices, and storage systems, but new racks are being introduced with larger widths in order to accommodate larger server devices, networking devices, and storage systems. For example, the Open Compute Project (OCP) has introduced the Open Rack version 3 (ORv3) that is provided with a 21-inch width that is capable of housing "21-inch" server devices, networking devices, and storage systems. However, as users transition to such larger racks, the use of 19-inch server devices, networking devices, and storage systems will continue. Conventional adapter systems exist that allow a single 19-inch width server device to be housed in a 21-inch width rack, but such conventional adapters are complex and cumbersome to deploy and result in relatively large amounts of packaging waste, particularly when utilized with a relatively large number of server devices. For example, for any Rack Unit (RU) slot in a conventional ORv3 rack that will house a device having a 19 inch width, ORv3 rails must be provided on the ORv3 rack for that RU slot, a conversion shelf must be mounted to those ORv3 rails, and a device rail system must then be mounted to that conversion shelf in order to allow a single 19-inch server device to be coupled to the ORv3 rack.

Accordingly, it would be desirable to provide a rack width adapter system that addresses the issues discussed above.

SUMMARY

According to one embodiment, a multi-device rack width adapter system includes a first multi-device rack width adapter subsystem that is configured to be mounted to a first side of a rack and positioned in a rack housing that is defined by the rack with a first housing width; a second multi-device rack width adapter subsystem that is configured to be mounted to a second side of the rack and positioned in the device housing defined by the rack; and a plurality of pairs of device coupling elements that each include a first device coupling element provided on the first multi-device rack width adapter subsystem and a second device coupling element provided on the second multi-device rack width adapter subsystem, wherein each pair of device coupling elements is configured, when the first multi-device rack width adapter subsystem is mounted to the first side of a rack and the second multi-device rack width adapter subsystem is mounted to the second side of a rack, to couple a respective device to the rack in a device housing that is defined by that pair of device coupling elements with a second housing width that is smaller than the first housing width.

BRIEF DESCRIPTION OF THE DRAWINGS

FIG. 2A is a front perspective view illustrating an embodiment of a rack that may be used with the multi-device rack width adapter system of the present disclosure.

FIG. 5C is a perspective view illustrating an embodiment of one of the plurality of single-device adapter rails disconnected from the multi-device rack width adapter subsystem of FIGS. 5A and 5B.

FIG. 5D is a front view illustrating an embodiment a pair of the multi-device rack width adapter subsystems of FIGS. 5A and 5B that provide the multi-device rack width adapter system of the present disclosure.

FIG. 6 is a perspective view illustrating an embodiment of a multi-device rail system coupled to the multi-device rack width adapter base of FIGS. 4A and 4B to provide a multi-device rack width adapter subsystem that may be included in the multi-device rack width adapter system of the present disclosure.

FIG. 8 is a flow chart illustrating an embodiment of a method for adapting a width of a rack to house devices.

DETAILED DESCRIPTION

For purposes of this disclosure, an information handling system may include any instrumentality or aggregate of instrumentalities operable to compute, calculate, determine, classify, process, transmit, receive, retrieve, originate, switch, store, display, communicate, manifest, detect, record, reproduce, handle, or utilize any form of information, intelligence, or data for business, scientific, control, or other purposes. For example, an information handling system may be a personal computer (e.g., desktop or laptop), tablet computer, mobile device (e.g., personal digital assistant (PDA) or smart phone), server (e.g., blade server or rack server), a network storage device, or any other suitable device and may vary in size, shape, performance, functionality, and price. The information handling system may include random access memory (RAM), one or more processing resources such as a central processing unit (CPU) or hardware or software control logic, ROM, and/or other types of nonvolatile memory. Additional components of the information handling system may include one or more disk drives, one or more network ports for communicating with external devices as well as various input and output (I/O) devices, such as a keyboard, a mouse, touchscreen and/or a video display. The information handling system may also include one or more buses operable to transmit communications between the various hardware components.

Figure 1:
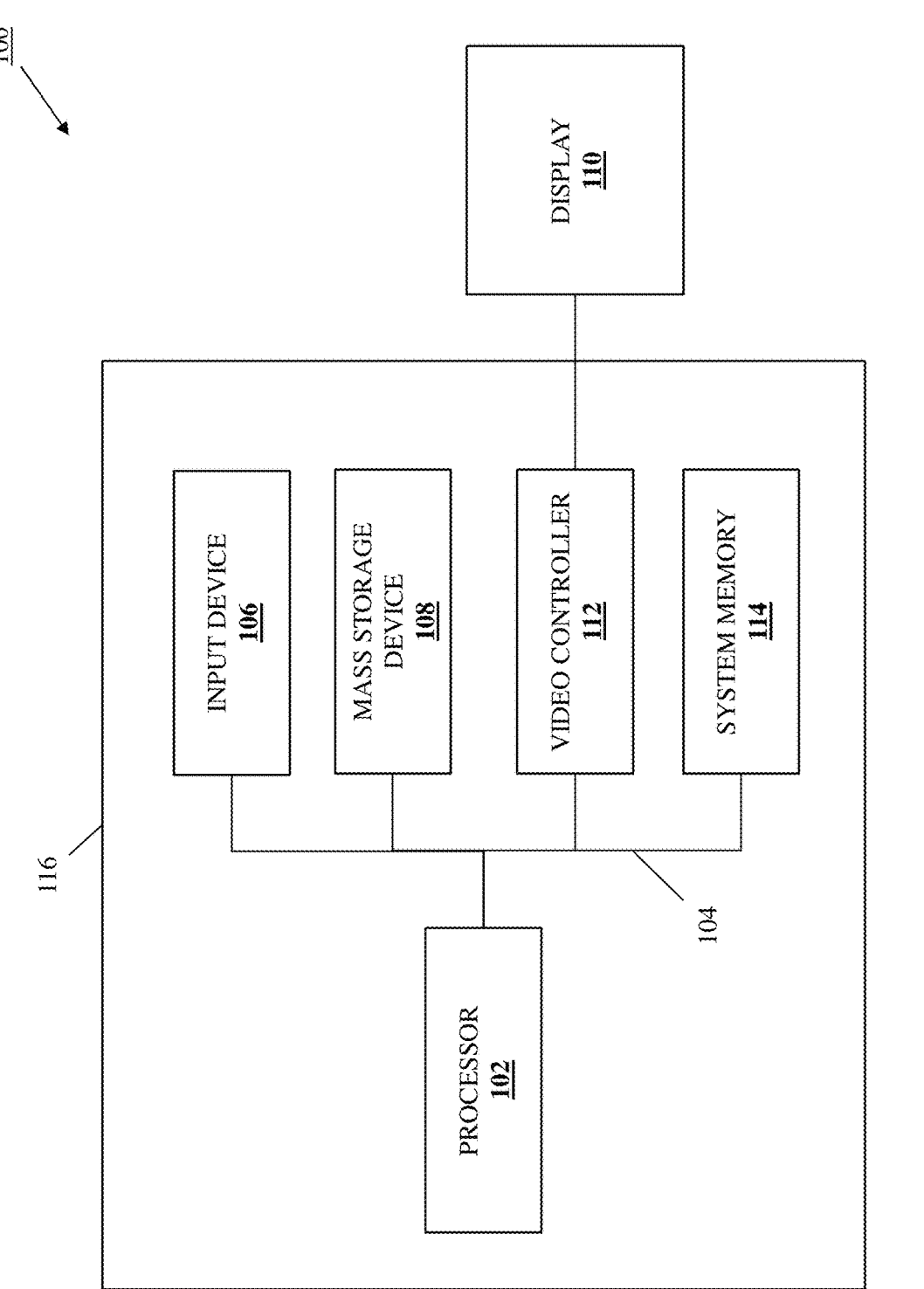
FIG. 1 is a schematic view illustrating an embodiment of an Information Handling System (IHS).

In one embodiment, IHS 100, FIG. 1, includes a processor 102, which is connected to a bus 104. Bus 104 serves as a connection between processor 102 and other components of IHS 100. An input device 106 is coupled to processor 102 to provide input to processor 102. Examples of input devices may include keyboards, touchscreens, pointing devices such as mouses, trackballs, and trackpads, and/or a variety of other input devices known in the art. Programs and data are stored on a mass storage device 108, which is coupled to processor 102. Examples of mass storage devices may include hard discs, optical disks, magneto-optical discs, solid-state storage devices, and/or a variety of other mass storage devices known in the art. IHS 100 further includes a display 110, which is coupled to processor 102 by a video controller 112. A system memory 114 is coupled to processor 102 to provide the processor with fast storage to facilitate execution of computer programs by processor 102. Examples of system memory may include random access memory (RAM) devices such as dynamic RAM (DRAM), synchronous DRAM (SDRAM), solid state memory devices, and/or a variety of other memory devices known in the art. In an embodiment, a chassis 116 houses some or all of the components of IHS 100. It should be understood that other buses and intermediate circuits can be deployed between the components described above and processor 102 to facilitate interconnection between the components and the processor 102.

Figure 2B:
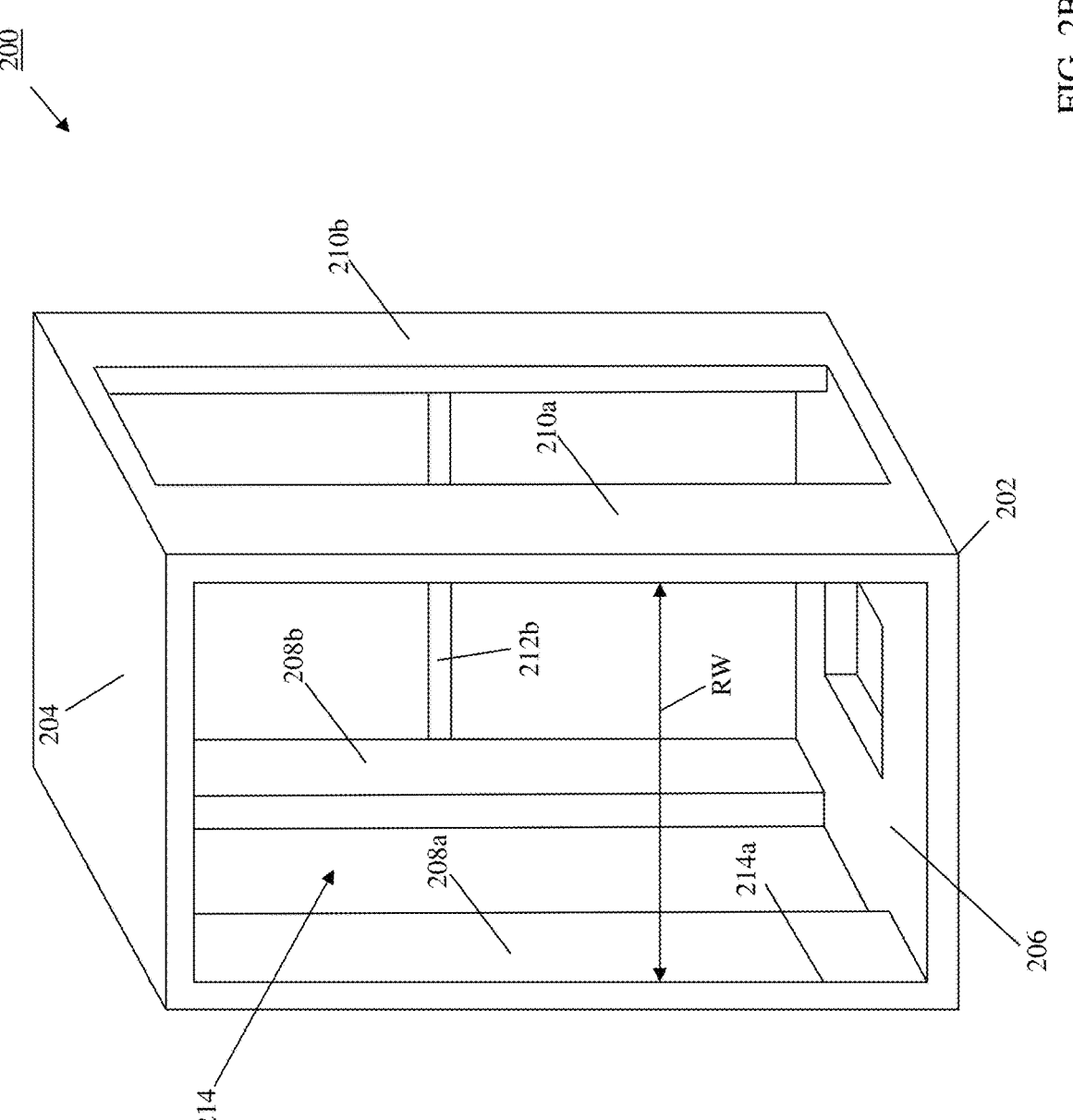
FIG. 2B is a perspective view illustrating an embodiment of the rack of FIG. 2A.

Referring now to FIGS. 2A and 2B, an embodiment of a rack 200 is illustrated that may be used with the multi-device rack width adapter system of the present disclosure. In the embodiments illustrated and described below, the rack 200 is provided by an Open Compute Project (OCP) Open Rack version 3 (ORv3) rack having dimensions defined in the ORv3 Base Specification that may include a rack width 21 inches that is configured to house "21-inch" server devices, networking devices, and/or storage systems as described below. However, while a specific rack including a specific width is illustrated and described below, one of skill in the art in possession of the present disclosure will appreciate how other racks having other widths may be utilized with the multi-device rack width adapter system of the present disclosure to adapt those racks to house devices that are dimensioned to be housed in conventional racks (e.g., that are configured to house "19-inch" server devices, networking devices, and/or storage systems) while remaining within the scope of the present disclosure as well.

With reference to FIGS. 2A and 2B, the rack 200 includes a base 202 having a top wall 204, a bottom wall 206 that is located opposite the base 202 from the top wall 204, a first side 208 that extends between the top wall 204 and the bottom wall 206 and that is provided by a plurality of vertical supports 208a and 208b in the illustrated example, and a second side 210 that is located opposite the base 202 from the first side 208, that extends between the top wall 204 and the bottom wall 206, and that is provided by a plurality of vertical supports 210a and 210b in the illustrated example. In the illustrated embodiment, a power distribution bus bar 212a and power distribution bus bar support 212b are included on a rear of the base 202 and extend between the top wall 204, the bottom wall 206, the first side 208, and the second side 210, and one of skill in the art in possession of the present disclosure will appreciate how the power distribution bus bar 212a may be configured to be coupled to a powering device when that powering device is positioned in the rack 200, as well as to couple to powered devices (e.g., the server devices described herein) when those devices are positioned in the rack 200. A rack housing 214 is defined between the top wall 204, the bottom wall 206, the sides 208 and 210 (i.e., the vertical supports 208a/208b and 210a/210b), and the power distribution bus bar 212a and power distribution bus bar support 212b, with a rack housing entrance 214a defined by a "front" surface of the top wall 204, the bottom wall 206, and the vertical supports 208a and 210a that is located opposite the base 202 from the power distribution bus bar 212a and power distribution bus bar support 212b.

As illustrated, the base 202 of the rack 200 defines a rack width RW between the first side 208 and the second side 210 of the base 202. As described below, the rack width RW may be configured to house "21-inch" devices that one of skill in the art in possession of the present disclosure will recognize may be configured to be housed in racks like the ORv3 rack described above, but one of skill in the art in possession of the present disclosure will appreciate how the actually measurement of the width of such devices or racks may vary. In an embodiment, the devices that will be housed in the rack 200 may be provided by the IHS 100 discussed above with reference to FIG. 1, and/or may include some or all of the components of the IHS 100, and in specific examples may be provided by server devices, networking devices (e.g., switch devices), storage systems, and/or other rack-housed computing devices that would be apparent to one of skill in the art in possession of the present disclosure. However, while illustrated and discussed as being provided by particular computing devices, one of skill in the art in possession of the present disclosure will recognize that that rack 200 may be configured to house other devices while remaining within the scope of the present disclosure as well. As such, while a specific rack is illustrated and described herein, one of skill in the art in possession of the present disclosure will recognize that the multi-device rack width adapter system of the present disclosure may be utilized with a variety of racks while remaining within the scope of the present disclosure as well.

Figure 3:
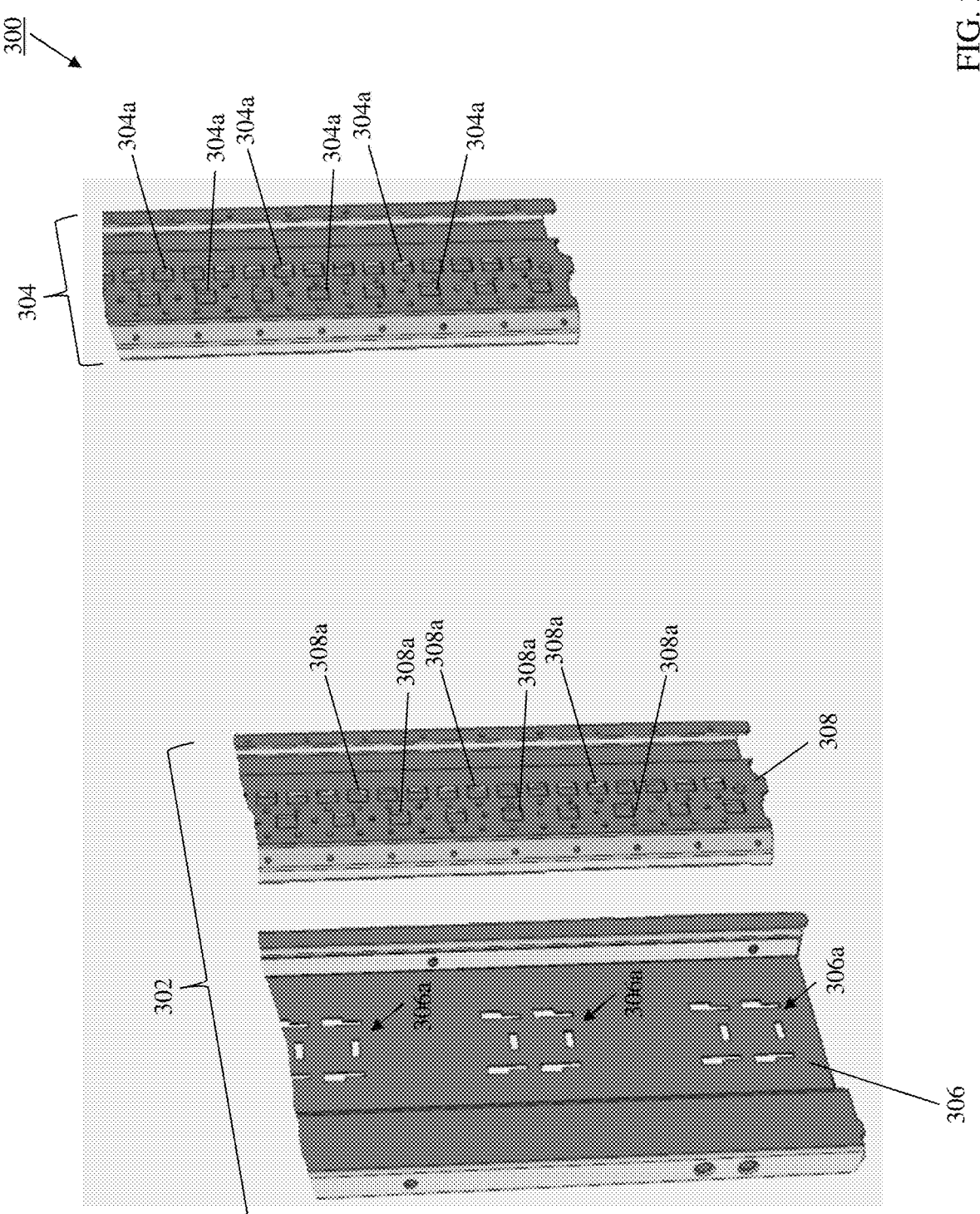
FIG. 3 is a perspective view illustrating an embodiment of supports that are included on the rack of FIGS. 2A and 2B.

Referring now to FIG. 3, an embodiment of a side 300 of a rack is illustrated that may provide each of the first side 208 and the second side 210 of the rack 200 discussed above with reference to FIG. 2. In the illustrated embodiment, the side 300 of the rack illustrated in FIG. 3 includes a vertical support 302 that may provide either of the vertical supports 208a or 210a discussed above with reference to FIG. 2, and a vertical support 304 that may provide either of the vertical supports 208b or 210b discussed above with reference to FIG. 2, and one of skill in the art in possession of the present disclosure will appreciate how the portion of the side 300 that is visible in FIG. 3 and described below (i.e., located on the vertical supports 208a/208b or 210a/210b) faces the rack housing 214 discussed above with reference to FIG. 2.

In the illustrated embodiment, the vertical support 302 includes a cable management beam 302a that defines a plurality of cable management element mounting apertures 306a that one of skill in the art in possession of the present disclosure will appreciate are configured to mount respective cable management elements to the cable management beam 306 in order to allow for the routing of cables on the rack 200 as described in further detail below. The vertical support 302 also includes an adapter system mounting beam 308 that defines a plurality of adapter system mounting apertures 308a, and the vertical support 304 defines a plurality of adapter system mounting apertures 304a that, as discussed below, are configured to mount the multi-device rack width adapter system of the present disclosure to the rack 200. As will be appreciated by one of skill in the art in possession of the present disclosure, a pair of the sides 300 may provide the first side 208 and the second side 210 of the rack 200 discussed above with reference to FIG. 2 and may be used to mount respective multi-device rack width adapter subsystems in the rack housing 214 as described in further detail below.

As will be appreciated by one of skill in the art in possession of the present disclosure, the adapter system mounting apertures 308a on the adapter system mounting beam 308 of the vertical support 302 and the adapter system mounting apertures 304a on the vertical support 304 may be provided as defined by the ORv3 Base Specification discussed above, and thus may be configured to couple "21-inch" devices to the rack 200 discussed above with reference to FIG. 2. In other words, the multi-device rack width adapter system of the present disclosure may be configured to couple to a conventional rack like the ORv3 rack described above that is configured to house "21-inch" devices in order to adapt that conventional rack to house "19-inch" devices. However, while a specific rack 200 with sides 300 has been illustrated and described, one of skill in the art in possession of the present disclosure will recognize that racks utilized with the multi-device rack width adapter system of the present disclosure may include a variety of components and/or component configurations for providing conventional rack functionality, as well as the multi-device rack width adapter functionality discussed below, while remaining within the scope of the present disclosure as well.

Figure 4A:
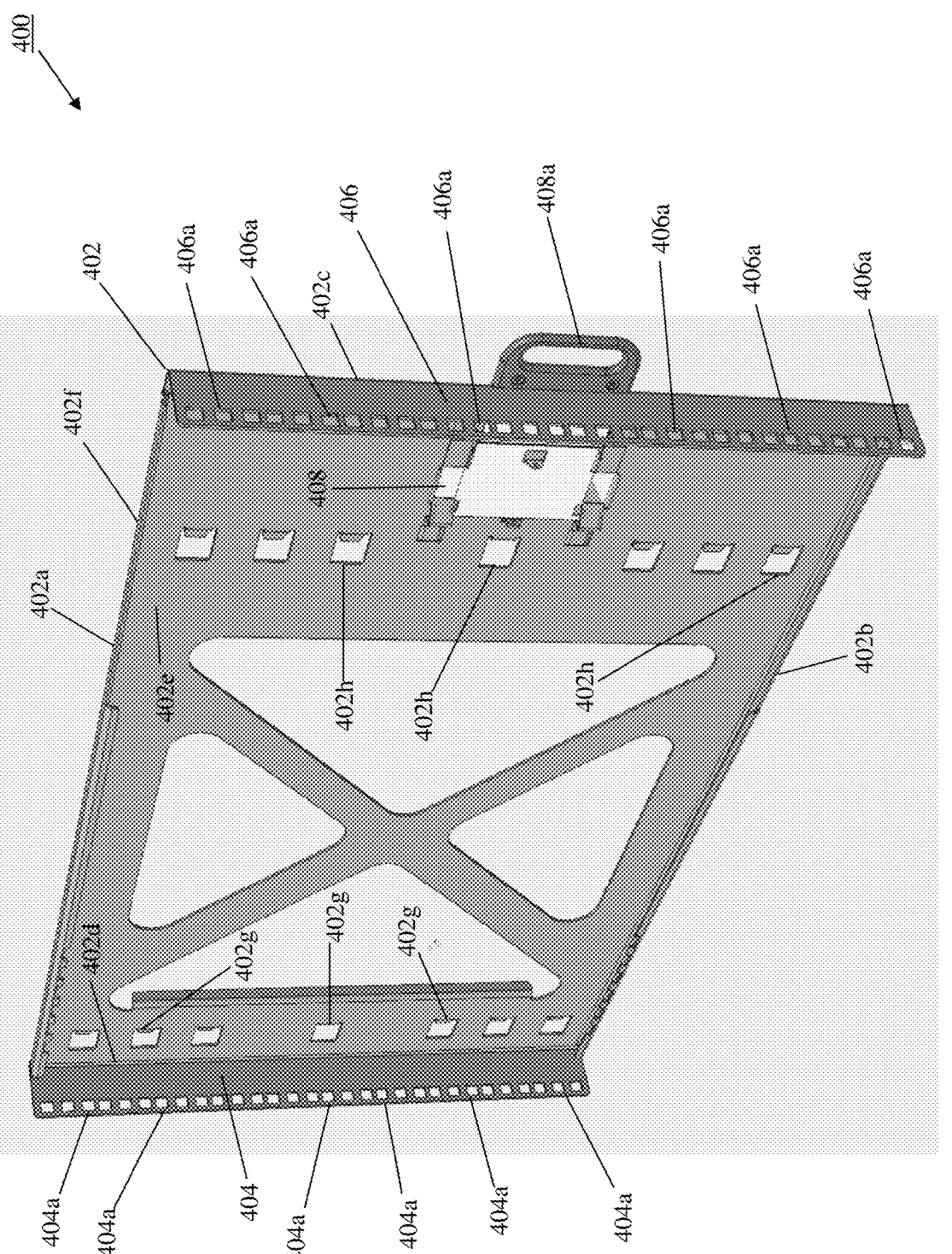
FIG. 4A is a perspective view illustrating an embodiment of a multi-device rack width adapter base that may be included in the multi-device rack width adapter system of the present disclosure.
Figure 4B:
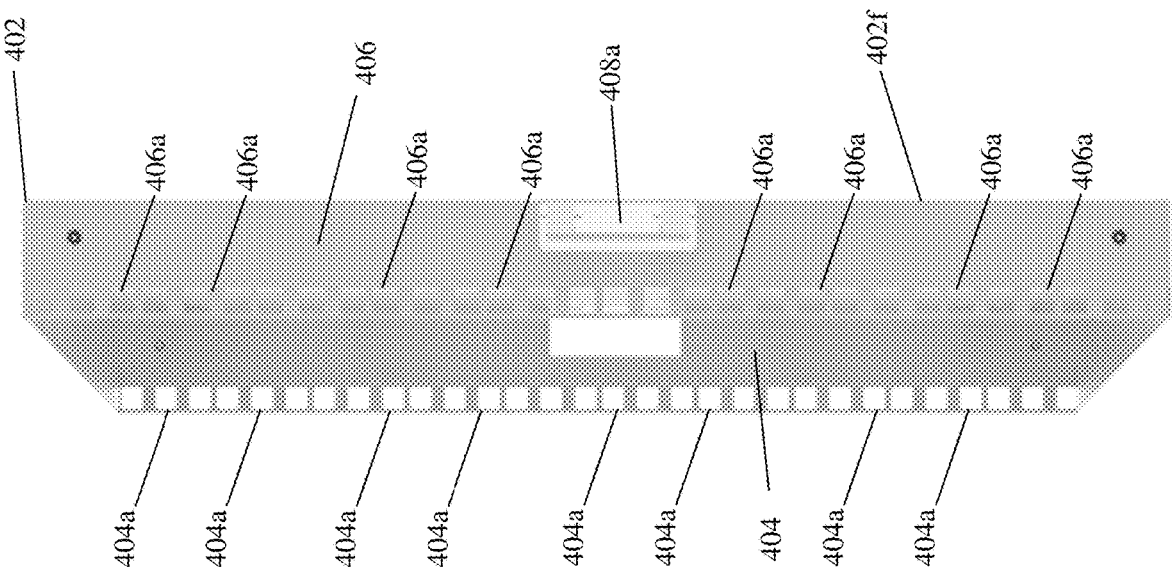
FIG. 4B is a perspective view illustrating an embodiment of the multi-device rack width adapter base of FIG. 3A.

Referring now to FIGS. 4A and 4B, an embodiment of a multi-device rack width adapter base 400 is illustrated that may be included in one of a pair of multi-device rack width adapter subsystems that provide the multi-device rack width adapter system of the present disclosure. In the illustrated embodiment, the multi-device rack width adapter base 400 includes a base 402 having a top edge 402a, a bottom edge 402b located opposite the base 402 from the top edge 402a, a front edge 402c that extends between the top edge 402a and the bottom edge 402b, a rear edge 402d that is located opposite the base 402 from the front edge 402c and that extends between the top edge 402a and the bottom edge 402b, and a pair of surfaces 402c and 402f that are located opposite the base 402 from each other and that each extend between the top edge 402a, the bottom edge 402b, the front edge 402c, and the rear edge 402d. Furthermore, the base 402 includes a plurality of rear rack mounting elements 402g in a spaced-apart orientation from each other between the top edge 402a and the bottom edge 402b of the base 402 and adjacent the rear edge 402d of the base 402, and a plurality of front rack mounting elements 402h in a spaced-apart orientation from each other between the top edge 402a and the bottom edge 402b of the base 402 and adjacent the front edge 402c of the base 402.

In the illustrated embodiment, a rear device coupling flange 404 extends substantially perpendicularly from the rear edge 402d of the base 402 along the length of the base 402, and defines a plurality of device coupling apertures 404a along its length. Similarly, a front device coupling flange 406 extends substantially perpendicularly from the front edge 402d of the base 402 along a length of the base 402, and defines a plurality of device coupling apertures 406a along its length. As will be appreciated by one of skill in the art in possession of the present disclosure, the rear device coupling flange 404 and the front device coupling flange 406, as well as the respective device coupling apertures 404a and 406a defined thereon, may be dimensioned similarly as provided on the conventional 19-inch EIA-310-D racks described above (e.g., including the conventional 19 inch width rack "square hole" mounting aperture configuration illustrated in FIG. 4A).

In one example, the "depth" of the multi-device rack width adapter base 400 as measured between the rear device coupling flange 404 and the front device coupling flange 406 may be provided to mount particular depth adapter rails to the multi-device rack width adapter base 400 that may be configured to couple to devices having a variety of depths. Furthermore, the rear device coupling flange 404 and the front device coupling flange 406 may be dimensioned such that, when a pair of the multi-device rack width adapter bases 400 are mounted to the rack 200 discussed above and adapter rails are mounted to the rear device coupling flange 404 and the front device coupling flange 406, "19-inch" devices may be coupled those adapter rails. As such, the device coupling apertures 404a and 406a defined by the rear device coupling flange 404 and the front device coupling flange 406 may be dimensioned to mount to a variety of adapter rails that would be apparent to one of skill in the art in possession of the present disclosure.

In the illustrated embodiment, a rack connection subsystem 408 may be included on the base 402 adjacent the front edge 402c, and one of skill in the art in possession of the present disclosure will appreciate how the rack connection subsystem 408 may include any of a variety of rack connection elements that are configured to engage the rack 200 discussed above with reference to FIG. 2 in order to connect the multi-device rack width adapter base 400 to the rack 200, as well as a handle 408a that may be configured to actuate the rack connection elements to allow the multi-device rack width adapter base 400 to be disconnected from the rack 200 following its connected to the rack 200 using the rack connection elements.

Figure 5A:
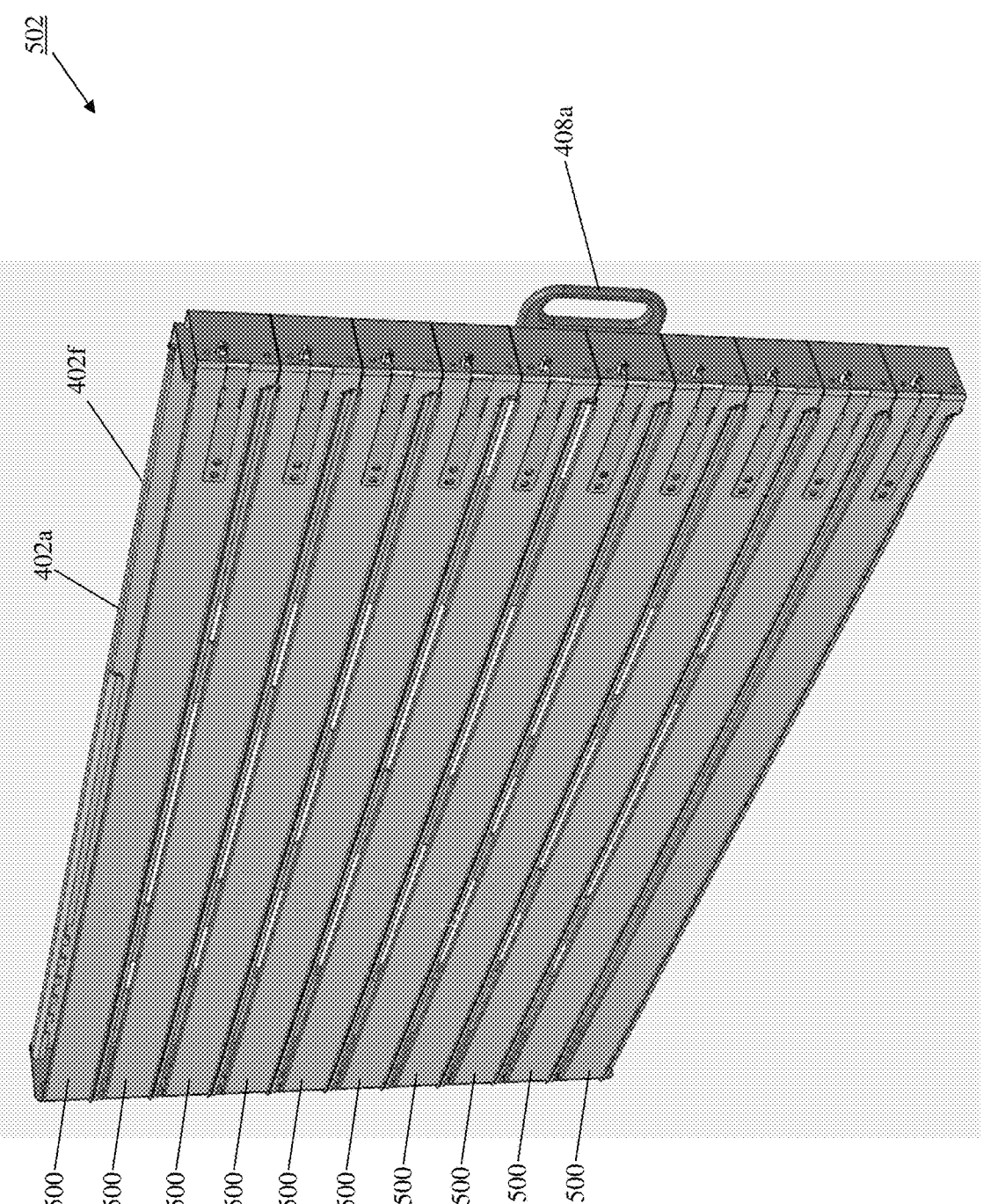
FIG. 5A is a front perspective view illustrating an embodiment of a plurality of single-device adapter rails coupled to the multi-device rack width adapter base of FIGS. 4A and 4B to provide a multi-device rack width adapter subsystem that may be included in the multi-device rack width adapter system of the present disclosure.
Figure 5B:
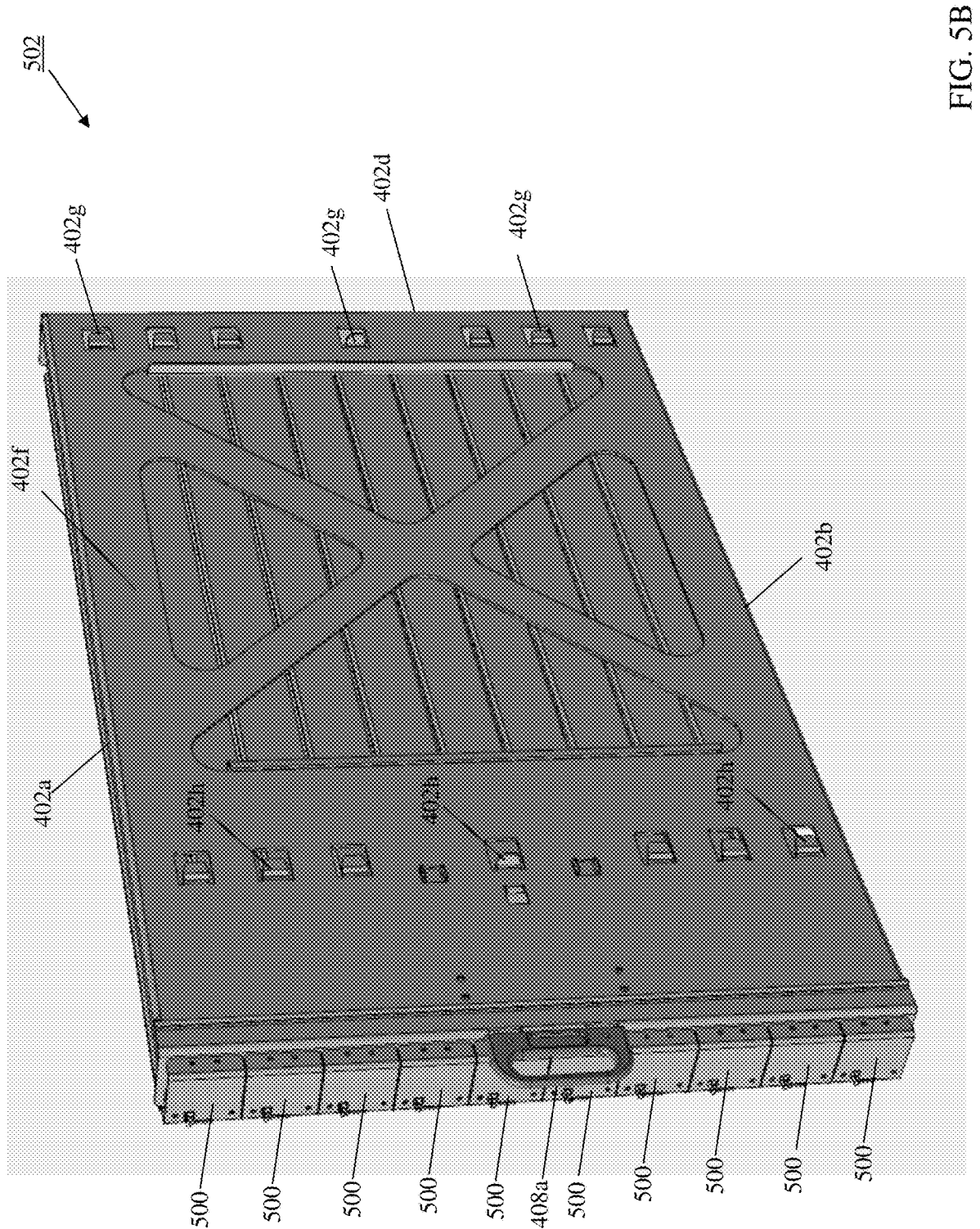
FIG. 5B is a rear perspective view illustrating an embodiment of the multi-device rack width adapter subsystem of FIG. 5A.

With reference to FIGS. 5A, 5B, and 5C, an embodiment of single-device adapter rails 500 are illustrated mounted to the multi-device rack width adapter base 400 discussed above with reference to FIGS. 4A and 4B in order to provide a multi-device rack width adapter subsystem 502. One of skill in the art in possession of the present disclosure will recognize that the single-device adapter rails 500 are illustrated herein as being provided by 1RU adapter rails, but will recognize that 2RU (or larger) adapter rails (or combinations of different sized adapter rails) may be provided on the multi-device rack width adapter subsystem 502 while remaining within the scope of the present disclosure as well.

As will be appreciated by one of skill in the art in possession of the present disclosure, each of the ten single-device adapter rails 500 illustrated in FIGS. 5A-5C may be mounted to the multi-device rack width adapter base 400 using a subset of the device coupling apertures 404a and 406a on the rear device coupling flange 404 and the front device coupling flange 406, respectively (e.g., via a "snap-fit" or other toolless engagement of that single-device adapter rail 500 and the subset of the device coupling apertures 404a and 406a on the rear device coupling flange 404 and the front device coupling flange 406). Furthermore, FIG. 5C illustrates how any of the single-device adapter rails 500 may be removed from the multi-device rack width adapter base 400 separately (e.g., by disengaging the "snap-fit" or other toolless engagement of that single-device adapter rail 500 and the subset of the device coupling apertures 404a and 406a on the rear device coupling flange 404 and the front device coupling flange 406).

As will be appreciated by one of skill in the art in possession of the present disclosure, each of the single-device adapter rails 500 illustrated in FIGS. 5A and 5B may be configured to receive a corresponding device rail that may be mounted to a device, discussed in further detail below. With reference to FIG. 5D, to provide a specific example that is discussed in further detail below, a multi-device rack width adapter system provider may provide pairs of the multi-device rack width adapter subsystems 502 to a user, with each of the plurality of single-device adapter rails 500 (e.g., 10 single-device adapter rails) mounted thereto and provided by proprietary adapter rails that are configured to receive proprietary device rails mounted to devices. As will be appreciated by one of skill in the art in possession of the present disclosure, this allows the user to mount any pair of the multi-device rack width adapter subsystems 502 to the rack 200 discussed above with reference to FIG. 2 to immediately enable devices having the proprietary device rails discussed above to be coupled to that rack 200, while also allowing the user to remove any one pair of corresponding single-device adapter rails 500 on the respective pair of the multi-device rack width adapter subsystems 502 and replace them with another pair of adapter rails that are configured to receive another type of device rails mounted to a device if desired.

However, while the multi-device rack width adapter base 400 is illustrated and primary described herein as utilizing the single-device adapter rails 500 described above, other embodiments of the present disclosure may provide multi-device adapter rail systems that include a plurality of adapter rails that are each configured to receive a corresponding device rail that may be mounted to a device. For example, with reference to FIG. 6, a multi-device adapter rail system 600 is illustrated mounted to the multi-device rack width adapter base 400 to provide a multi-device rack width adapter subsystem 602, with that multi-device adapter rail system 600 including ten adapter rails 600a that are each configured to receive a corresponding device rail that may be mounted to a device. As will be appreciated by one of skill in the art in possession of the present disclosure, the multi-device adapter rail system 600 may be mounted to the multi-device rack width adapter base 400 using any number of the device coupling apertures 404a and 406a on the rear device coupling flange 404 and the front device coupling flange 406, respectively (e.g., via a "snap-fit" or other toolless engagement of that multi-device adapter rail system 600 and the subset of the device coupling apertures 404a and 406a on the rear device coupling flange 404 and the front device coupling flange 406).

As will also be appreciated by one of skill in the art in possession of the present disclosure, each of the adapter rails 600a illustrated in FIG. 6 may be configured to receive a corresponding device rail that may be mounted to a device. Similarly as described above, a multi-device rack width adapter system provider may provide pairs of the multi-device rack width adapter subsystems 602 to a user, with the multi-device adapter rail system 600 mounted thereto as illustrated in FIG. 6 and provided by proprietary adapter rails that are configured to receive proprietary device rails mounted to devices. As will be appreciated by one of skill in the art in possession of the present disclosure, this allows the user to mount any pair of the multi-device rack width adapter subsystems 602 to the rack 200 discussed above with reference to FIG. 2 to immediately enable devices having the proprietary device rails discussed above to be coupled to that rack 200. However, one of skill in the art in possession of the present disclosure will appreciate how the adapter rail systems 600 on each multi-device rack width adapter subsystem 602 must be removed and replaced with pairs of adapter rails (and in some cases, one or more of the single-device adapter rails 500 discussed above) if devices with different types of device rails must be coupled to the rack 200.

Figure 7:
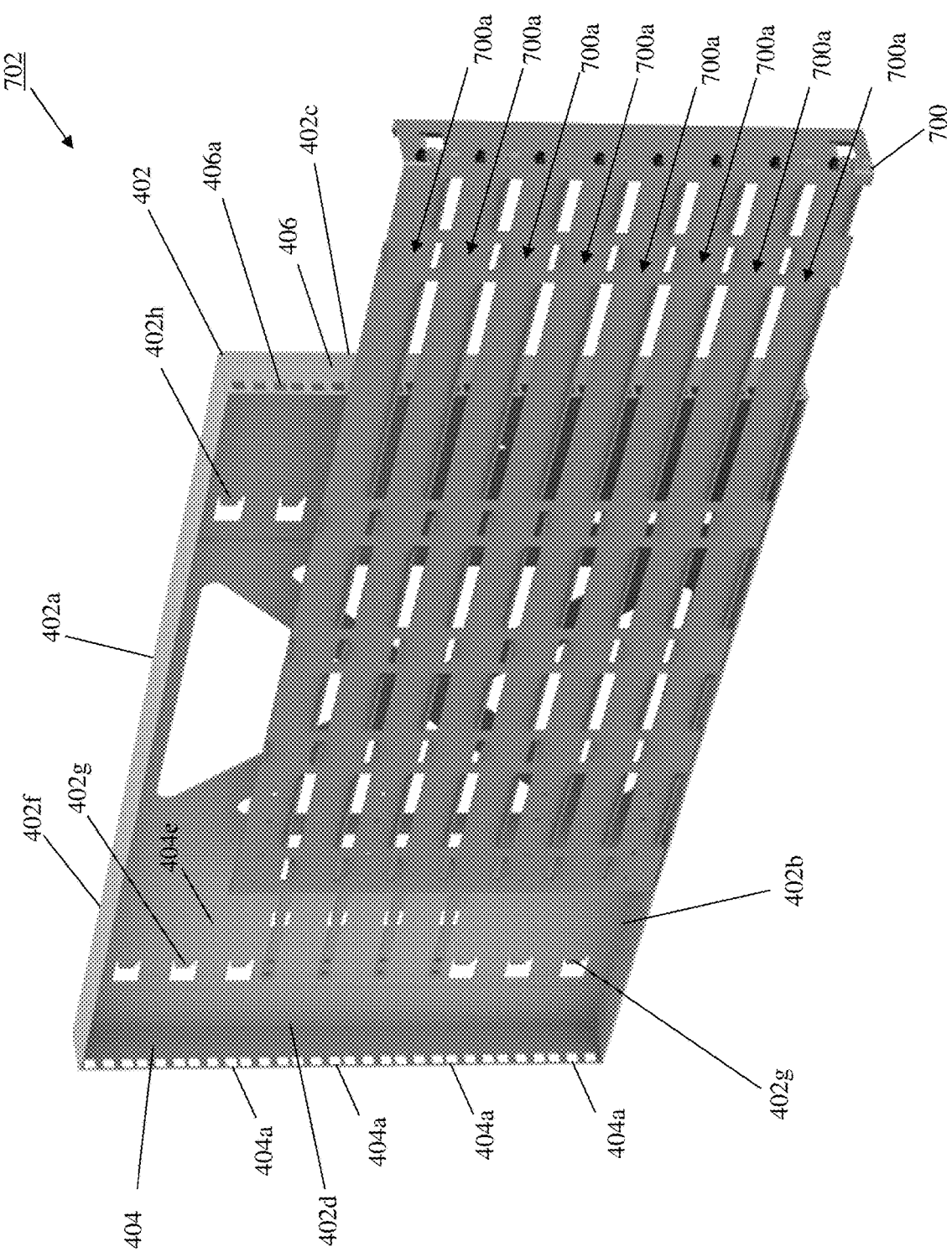
FIG. 7 is a perspective view illustrating an embodiment of a multi-device rail system being coupled to the multi-device rack width adapter base of FIGS. 4A and 4B to provide a multi-device rack width adapter subsystem that may be included in the multi-device rack width adapter system of the present disclosure.

In another example, with reference to FIG. 7, a multi-device adapter rail system 700 is illustrated being mounted to the multi-device rack width adapter base 400 to provide a multi-device rack width adapter subsystem 702, with that multi-device adapter rail system 700 including eight adapter rails 700a that are each configured to receive a corresponding device rail that may be mounted to a device. As will be appreciated by one of skill in the art in possession of the present disclosure, the multi-device adapter rail system 700 may be mounted to the multi-device rack width adapter base 400 using any number of the device coupling apertures 404a and 406a on the rear device coupling flange 404 and the front device coupling flange 406, respectively (e.g., via a "snap-fit" or other toolless engagement of that multi-device adapter rail system 700 and the subset of the device coupling apertures 404a and 406a on the rear device coupling flange 404 and the front device coupling flange 406).

As will be appreciated by one of skill in the art in possession of the present disclosure, each of the adapter rails 700a illustrated in FIG. 7 may be configured to receive a corresponding device rail that may be mounted to a device. Similarly as described above, a multi-device rack width adapter system provider may provide pairs of the multi-device rack width adapter subsystems 702 to a user, with the multi-device adapter rail system 700 mounted thereto and provided by proprietary adapter rails that are configured to receive proprietary device rails mounted to devices. As will be appreciated by one of skill in the art in possession of the present disclosure, this allows the user to mount any pair of the multi-device rack width adapter subsystems 702 to the rack 200 discussed above with reference to FIG. 2 to immediately enable devices having the proprietary device rails discussed above to be coupled to that rack 200, while also allowing the user to provide two pairs of adapter rails if devices with different types of device rails must be coupled to the rack 200 (or the single-device adapter rails 500 discussed above if additional devices with the corresponding proprietary device rails are to-be coupled to the rack). However, while a multi-device adapter rail system 700 that leaves two adapter rails mounting spaces on the multi-device rack width adapter base 400 to allow different types of adapter rails to be mounted to the multi-device rack width adapter base 400 has been illustrated and described, one of skill in the art in possession of the present disclosure will appreciate how adapter rail systems may be provided with any number of adapter rails while remaining within the scope of the present disclosure.

As such, while several examples of the provisioning of adapter rails on the multi-device rack width adapter base 400 have been illustrated and described, one of skill in the art in possession of the present disclosure will appreciate how any of a variety of adapter rails and/or adapter rail systems may be configured for a desired use (e.g., the coupling of some number of devices to a rack with proprietary devices rails, some number of devices to a rack with non-proprietary devices rails, etc.) and provided with the multi-device rack width adapter base 400 in order to enable that desired use while remaining within the scope of the present disclosure.

Referring now to FIG. 8, an embodiment of a method 800 for adapting a width of a rack to house devices is illustrated. As discussed below, the systems and methods of the present disclosure provide a multi-device rack width adapter system that mounts to a rack having a rack housing with a first housing width, that defines device housings having a second housing width that is smaller than the first housing width, and that is configured to coupled multiple devices to the rack in those device housings. For example, the multi-device rack-width-adapted rack system of the present disclosure may include a multi-device rack width adapter system mounted to a rack having first and second sides defining a rack housing having a first housing width. The multi-device rack width adapter system includes a first multi-device rack width adapter subsystem in the rack housing mounted to the first side of the rack, a second multi-device rack width adapter subsystem in the rack housing mounted to the second side of the rack, and pairs of device coupling elements that each include a first device coupling element on the first multi-device rack width adapter subsystem and a second device coupling element on the second multi-device rack width adapter subsystem. Each pair of device coupling elements may couple a respective second device to the rack in a second device housing defined by that pair of device coupling elements with a second housing width that is smaller than the first housing width. As such, multiple devices that are configured to mount to relatively smaller width racks may be quickly and easily coupled to relatively larger width racks.

Figure 9:
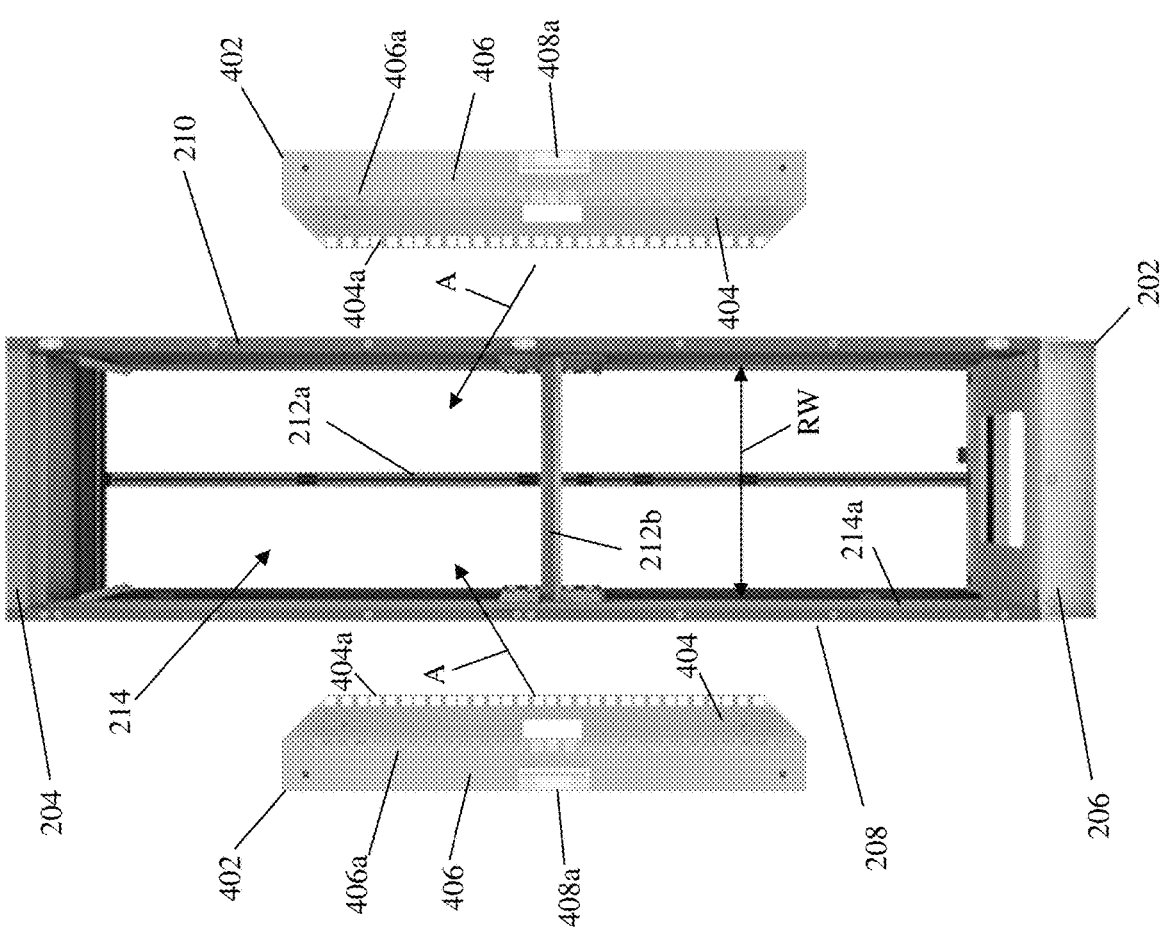
FIG. 9 is a front perspective view illustrating an embodiment of a pair of the multi-device rack width adapter bases of FIGS. 4A and 4B being coupled to the rack of FIGS. 2A, 2B, and 2C.

The method 800 begins at block 802 where one or more pairs of multi-device rack width adapter subsystems are mounted to a rack with a rack housing having a first housing width to defined device housings having a second housing width. With reference to FIG. 9, in an embodiment of block 802, a pair of the multi-device rack width adapter bases 400 discussed above with reference to FIGS. 4A and 4B may be positioned adjacent the rack mounting entrance 214a of the rack 200 such that a first of the pair of multi-device rack width adapter bases 400 is located adjacent the first side 208 of the rack 200, and a second of the pair of multi-device rack width adapter bases 400 is located adjacent the second side 210 of the rack 200. Each of the pair of multi-device rack width adapter bases 400 may then be moved in a direction A through the rack housing entrance 214a and into the rack housing 214, and may be mounted to the first side 208 and the second side 210 of the rack 200, respectively, in order to, for example, provide conventional EIA-310-D 19-inch width rack "square hole" mounting aperture to be provided in a 21-inch ORv3 rack.

One of skill in the art in possession of the present disclosure will recognize that the pair of multi-device rack width adapter bases 400 are illustrated in FIG. 9 as being coupled to the rack 200 without any adapter rails, but as discussed above the multi-device rack width adapter bases 400 may be coupled to the rack 200 as the multi-device rack width adapter subsystems 502 that may include any (and in some cases all) of the single-device adapter rails 500 discussed above with reference to FIGS. 5A-5D, as multi-device rack width adapter subsystems 602 that may include the multi-device adapter rail system 600 discussed above with reference to FIG. 6, as multi-device rack width adapter subsystems 702 that may include the multi-device adapter rail system 700 discussed above with reference to FIG. 7, and/or as any other multi-device rack width adapter subsystems that one of skill in the art in possession of the present disclosure would recognize as being provided according to the teachings of the present disclosure.

Figure 10A:
FIG. 10A is a perspective view illustrating an embodiment of the multi-device rack width adapter subsystem of FIGS. 5A and 5B coupled to the rack of FIGS. 2A, 2B, and 2C.
Figure 10B:
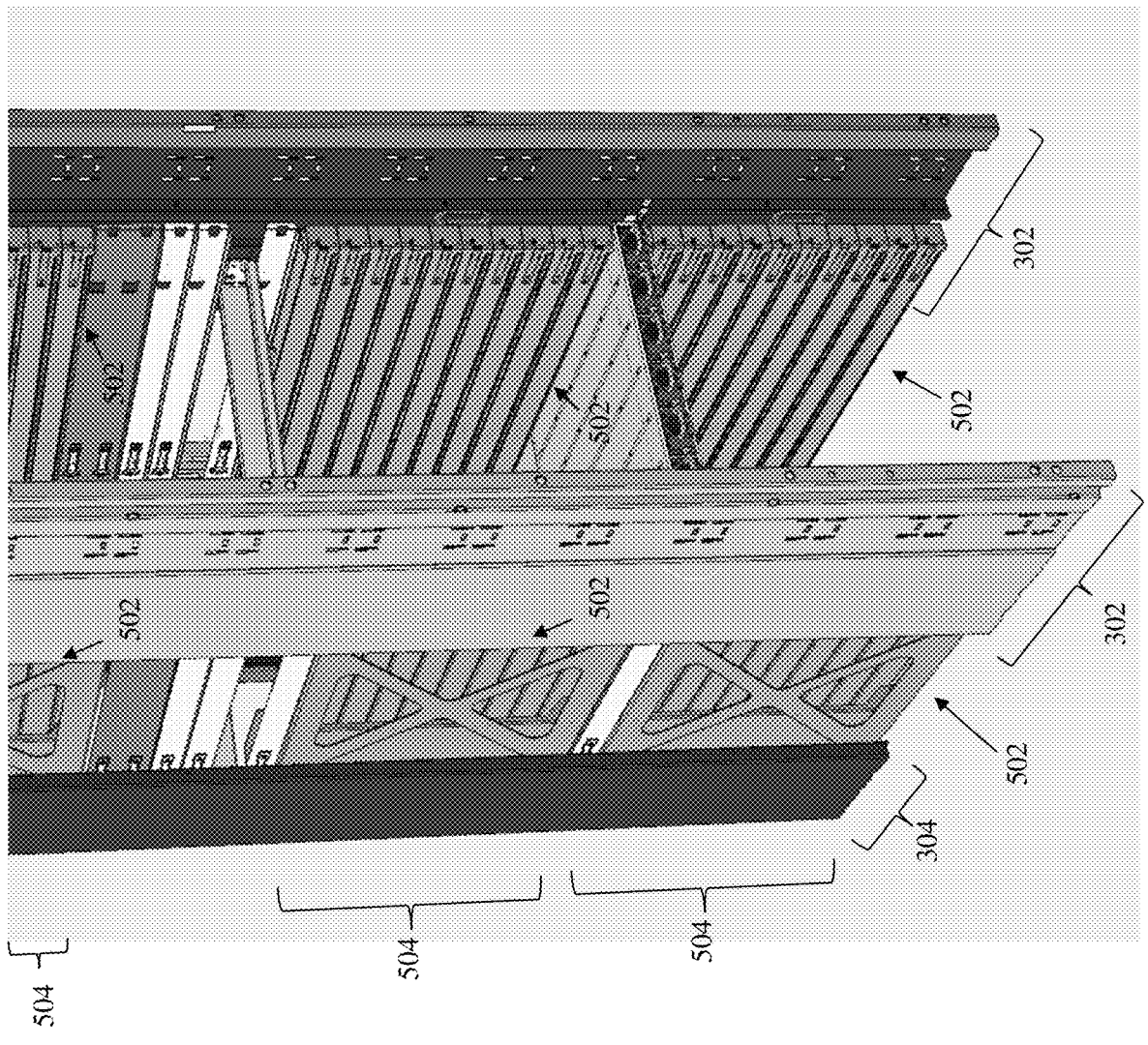
FIG. 10B is a perspective view illustrating an embodiment of a plurality of the multi-device rack width adapter systems of FIG. 5D coupled to the rack of FIGS. 2A, 2B, and 2C.
Figure 10C:
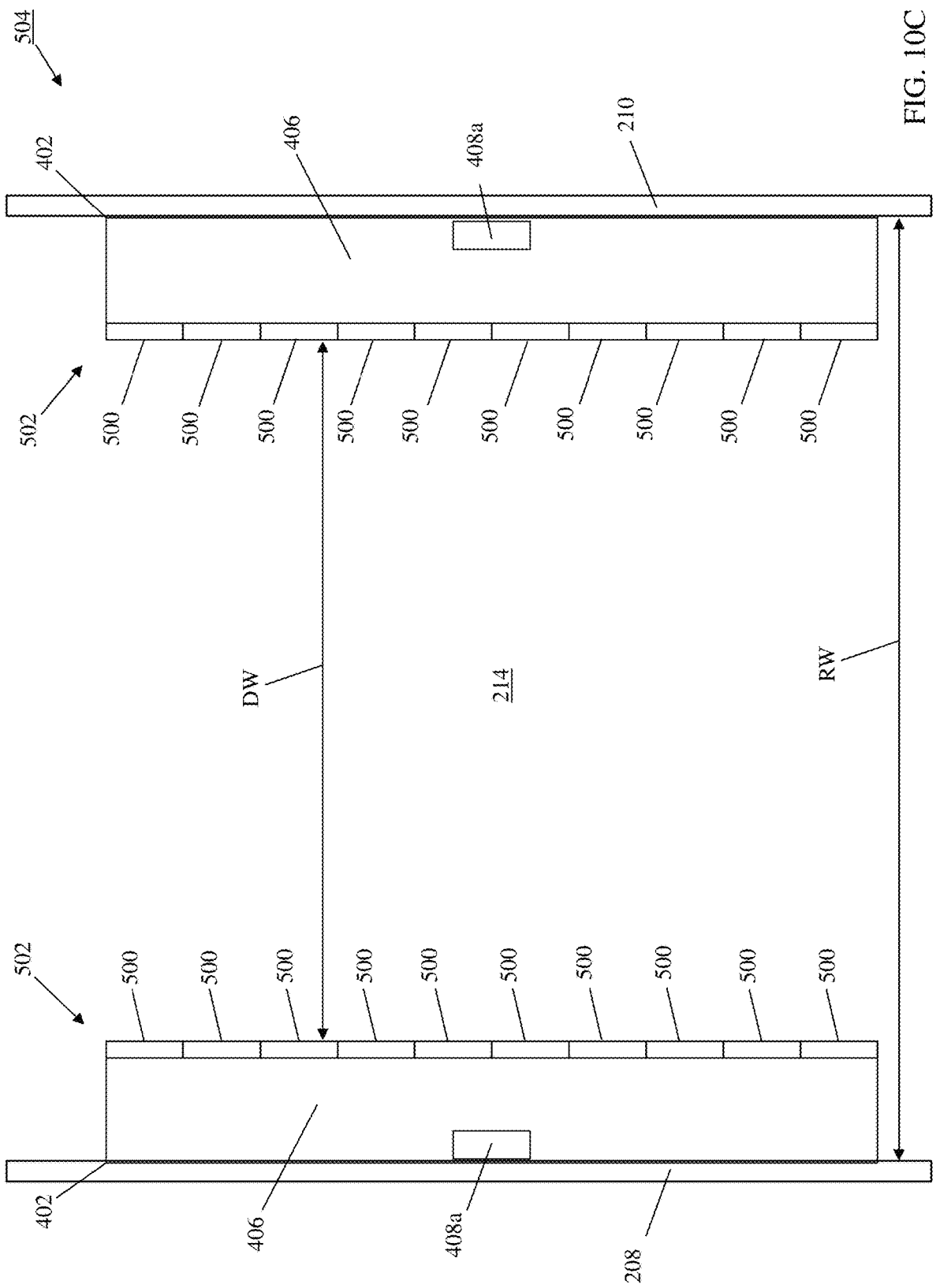
FIG. 10C is a front view illustrating an embodiment of a multi-device rack width adapter system of FIG. 5D coupled to the rack of FIGS. 2A, 2B, and 2C.

For example, with reference to FIGS. 10A, 10B, and 10C, the multi-device rack width adapter subsystems 502 provided by the multi-device rack width adapter bases 400 discussed above with reference to FIG. 9 and including all of the single-device adapter rails 500 discussed above with reference to FIGS. 5A-5D are illustrated mounted to the rack

200. With reference first to FIG. 10A, one of skill in the art in possession of the present disclosure will appreciate how the movement of the multi-device rack width adapter subsystem 502 into the rack housing 214 and adjacent the side 210 of the rack 200 allows at least some of the rear rack mounting elements 402*g* on the multi-device rack width adapter subsystem 502 to engage the adapter system mounting apertures 304*a* on the vertical support 304 of the side wall 202, and at least some of the front rack mounting elements 402*h* on the multi-device rack width adapter subsystem 502 to engage the adapter system mounting apertures 308*a* on the adapter system mounting beam 308 in the vertical support 302 of the side wall 202. Furthermore, one of skill in the art in possession of the present disclosure will appreciate how the multi-device rack width adapter subsystem 502 may then be secured to the side 210 of the rack 200 (e.g., via a "snap-fit" or other toolless engagement of that multi-device rack width adapter subsystem 502 and the side 210 of the rack 200, engagement of the rack connection subsystem 408 on the multi-device rack width adapter base 400 with the vertical support 302 adjacent the rack housing entrance 214*a*, and/or the engagement of other securing features that would be apparent to one of skill in the art in possession of the present disclosure).

With reference now to FIG. 10B, a plurality of pairs of multi-device rack width adapter subsystems 502, which each include all of the single-device adapter rails 500 discussed above with reference to FIGS. 5A-5D, are illustrated mounted to the rack 200, and one of skill in the art in possession of the present disclosure will appreciate how each of the multi-device rack width adapter subsystems 502 may be secured to the side wall 208 or 210 similarly as described above. Furthermore, as illustrated, different pairs of the multi-device rack width adapter subsystems 502 may be separated in the rack 200 to allow for the mounting of "21-inch" devices that correspond to the rack width RW (e.g., via rack rails on the rack 200 and the device rails on the device similarly as described above), with FIG. 10B illustrating a single such device positioned in a Rack Unit (RU) that was left open via the spacing of multi-device rack width adapter subsystems 502 on different multi-device rack width adapter systems 504. However, while a single RU has been illustrated and described as housing a "21-inch" device, as can be seen in FIG. 10B multiple RUs may be left open via the spacing of multi-device rack width adapter subsystems 502 on different multi-device rack width adapter systems 504 (e.g., the three "21-inch" 1RU spaces and one "21-inch" 2RU space illustrated in FIG. 10B) while remaining within the scope of the present disclosure as well.

With reference to FIG. 10C, a multi-device rack width adapter system 504 mounted to the rack 202 is illustrated that is provided by a pair of multi-device rack width adapter subsystems 502 mounted to the side walls 208 and 210, respectively, of the rack 202. As can be seen, the multi-device rack width adapter subsystem 504 is provided in the rack housing 214 with the rack width RW, and single-device adapter rails 500 on the pair of multi-device rack width adapter subsystems 502 provide a device housing having a device housing width DW that is less than the rack width RW (e.g., a device housing width DW of 19 inches that is configured to house "19-inch" devices vs. a rack housing width RW of 21 inches that is configured to house "21-inch" devices).

However, while the multi-device rack width adapter system 504 including the single-device adapter rails 500 is illustrated and described as being mounted to the rack 200, one of skill in the art in possession of the present disclosure with recognize how multi-device rack width adapter systems utilizing the multi-device rack width adapter subsystems 602 including the multi-device adapter rail system 600 discussed above with reference to FIG. 6, multi-device rack width adapter systems utilizing the multi-device rack width adapter subsystems 702 including the multi-device adapter rail system 700 discussed above with reference to FIG. 7, and/or any other multi-device rack width adapter systems provided according to the teachings of the present disclosure, may be mounted to the rack 200 in a similar manner while remaining within the scope of the present disclosure as well.

Figure 11:
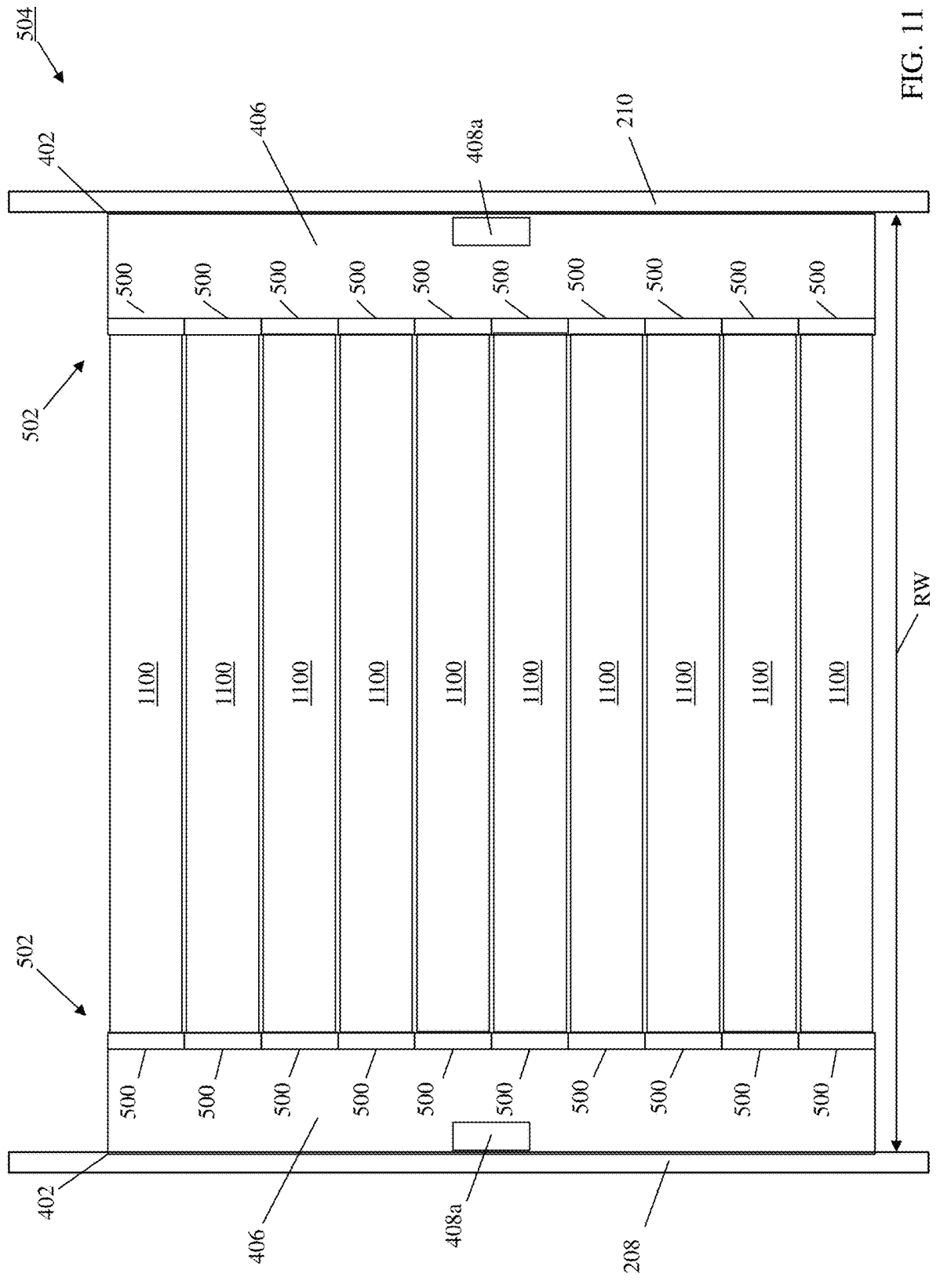
FIG. 11 is a front view illustrating an embodiment of a plurality of devices coupled to the multi-device rack width adapter system on the rack of FIG. 10C.

The method 800 then proceeds to block 804 where one or more pairs of device coupling elements on respective multi-device rack width adapter subsystems engage devices to couple the devices to the rack. With reference to FIG. 11, in an embodiment of block 804, each of a plurality of devices 1100 may be coupled to the rack 202 via respective pairs of device coupling elements provided by the single-device adapter rails 500 mounted on the respective multi-device rack width adapter subsystems 502 coupled to each of the first side 208 and the second side 210 of the rack 200. As described above, each device 1100 may include a pair of device rails (not illustrated in FIG. 11) on its opposing sides that each engage one of the pair of single-device adapter rails 500 discussed above to couple that device 1100 to the rack 200. As such, a plurality of devices 1100 that are configured to be housed in the device width DW (e.g., 19-inches) may be coupled to a rack 200 having a rack width RW (e.g., 21 inches) that is greater than the device width DW.

As discussed above, in specific examples, each of the multi-device rack width adapter systems 504 may be provided to a user with its pair of multi-device rack width adapter subsystems 502 having all ten single-device adapter rails 500 mounted thereto, which allows the user to quickly and easily mount those multi-device rack width adapter systems 504 to the rack 200, as well as quickly and easily couple devices that include corresponding device rails (which may be provided to the user with those device rails mounted thereto) to the rack 200 via those multi-device rack width adapter systems 504. As such, the time and effort needed to provide multiple devices having the device width DW in a rack having the rack width RW is substantially reduced relative to conventional rack width adapter systems that require a user to configure each 1RU device housing in the rack to adapt it for a smaller device.

The method 800 then proceeds to decision block 806 where the method 800 proceeds depending on whether one or more devices that are to-be coupled to the rack require second device coupling elements. As will be appreciated by one of skill in the art in possession of the present disclosure, in some situations a user may wish to couple a device to the rack 200 using device coupling elements that are different than those that are currently provided on the multi-device rack width adapter system 504. For example, as described above, each of the plurality of single-device adapter rails 500 may be provided by proprietary adapter rails that are configured to receive proprietary device rails mounted to devices, and a user adapting the rack width of the rack 200 to house devices having the device width DW may wish to couple those devices to the rack 200 using adapter rails/device rails other than those proprietary adapter rails/proprietary device rails. As such, at decision block 806, the method 800 may proceed depending on whether any of the device coupling elements on the multi-device rack width adapter system 504 must be replaced with other device coupling elements in order to couple a device to the rack 200. If, at decision block 806, no devices are to-be coupled to the rack that require second device coupling elements, the method 800 returns to decision block 806. As such, the method 800 may loop until device(s) are to-be coupled to the rack 200 that require the current adapter rails on the multi-device rack width adapter system 504 to be replaced.

If at decision block 806, devices are to-be coupled to the rack that require second device coupling elements, the method 800 proceeds to block 808 where one or more pairs of first device coupling elements on respective multi-device rack width adapter subsystems are replaced with respective pairs of second device coupling elements. As discussed above with reference to FIG. 5C, any of the single-device adapter rails 500 may be separately removed from the multi-device rack width adapter base 400. As such, in an embodiment of block 808 and in the event a device is to-be coupled to the rack 200 that requires adapter rails that are different to than the single-device adapter rails 500 (e.g., the device rails on that device are not compatible with the single-device adapter rails 500), the single-device adapter rails 500 on the respective multi-device rack width adapter subsystems 502 mounted to the first side 208 and the second side 210 of the rack 200 that define the device housing in which that device will be housed may be removed from those multi-device rack width adapter subsystems 502, and replaced with the required adapter rails (e.g., adapter rails that are compatible with the device rails on the device that is to-be coupled to the rack 200).

Figure 12:
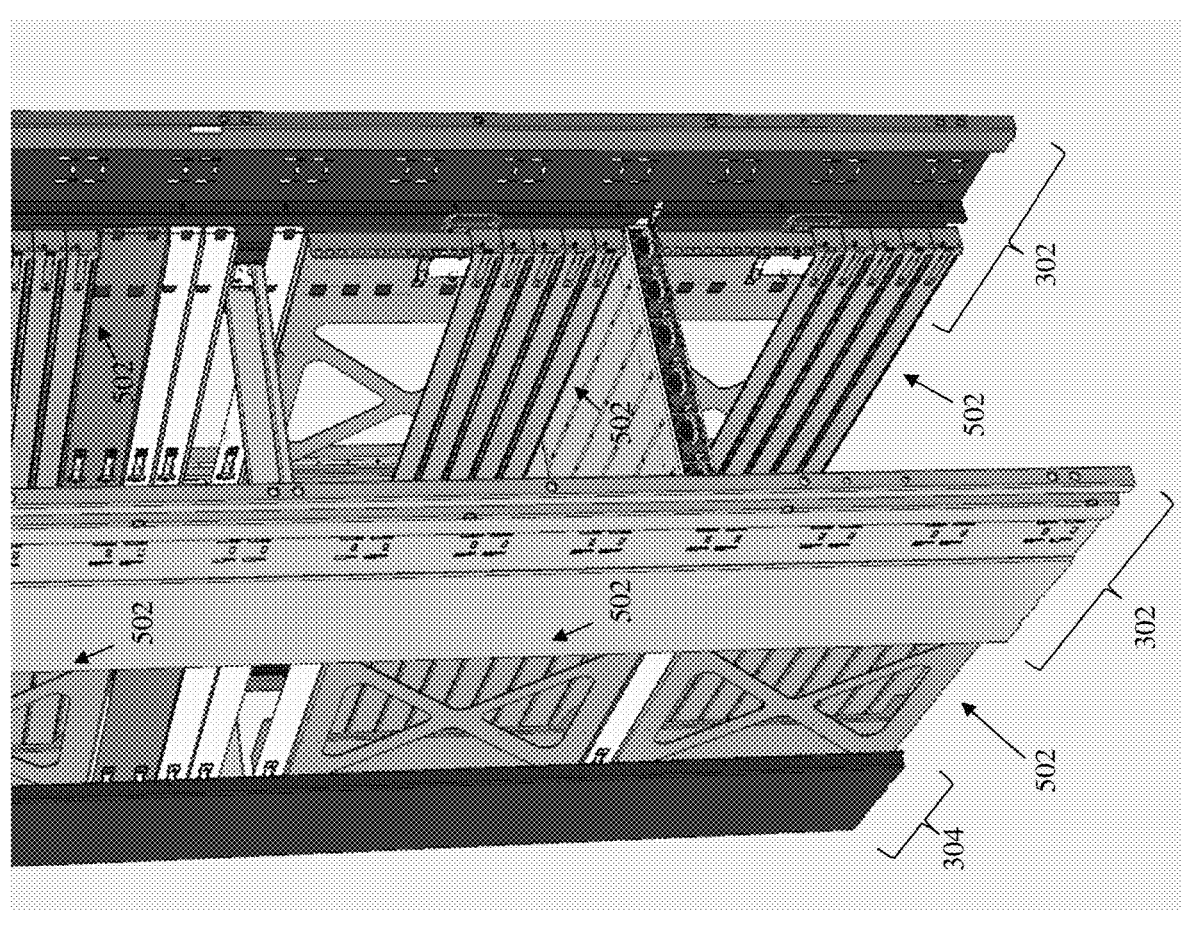
FIG. 12 is a perspective view illustrating an embodiment of a plurality of the multi-device rack width adapter systems of FIG. 5D coupled to the rack of FIGS. 2A, 2B, and 2C with a subset of the single-device adapter rails of FIGS. 5A, 5B, and 5C removed.
Figure 13:
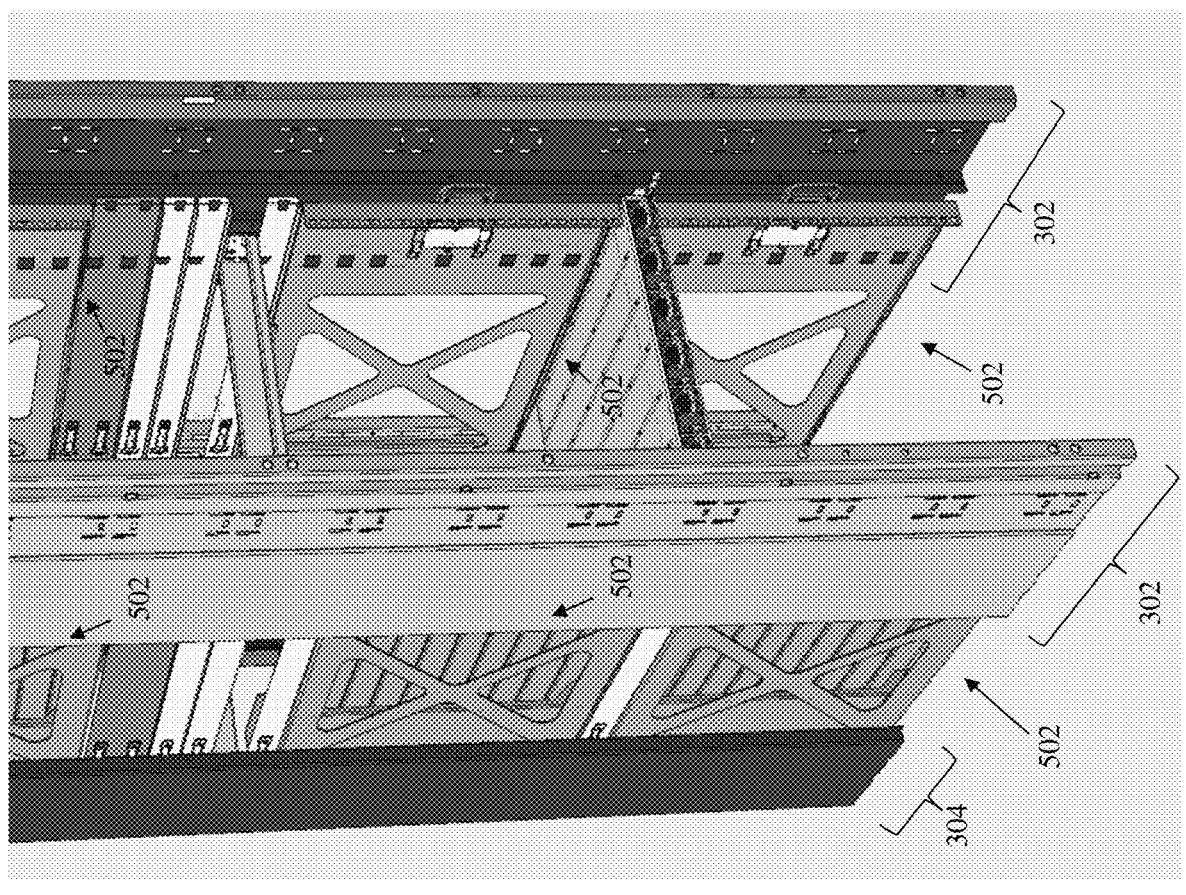
FIG. 13 is a perspective view illustrating an embodiment of a plurality of the multi-device rack width adapter systems of FIG. 5D coupled to the rack of FIGS. 2A, 2B, and 2C with all of the single-device adapter rails of FIGS. 5A, 5B, and 5C removed.

For example, FIG. 12 illustrates how five of the ten single-device adapter rails 500 may be removed from each pair of multi-device rack width adapter subsystems 502 that provide a multi-device rack width adapter system 504, while FIG. 13 illustrates how all ten single-device adapter rails 500 may be removed from each pair of multi-device rack width adapter subsystems 502 that provide a multi-device rack width adapter system 504. While not illustrated or described in detail, one of skill in the art in possession of the present disclosure will appreciate how other adapter rails (or the adapter rail systems 600 or 700 described above) may then be mounted to the multi-device rack width adapter subsystems 502 that provide a multi-device rack width adapter system 504 (e.g., via the conventional 19-inch width rack "square hole" mounting apertures described above) and used to couple devices to the rack 200 similarly as described above.

While not illustrated or described in detail, one of skill in the art in possession of the present disclosure will appreciate how cable management elements may be mounted to the cable management beams 306a on the vertical supports 208a and 210 via the cable management element mounting apertures 306a defined thereon, and may be used to route cables along the front and sides 208 and 210 of the rack 200.

Thus, systems and methods have been described that provide a multi-device rack width adapter system that mounts to a rack having a rack housing with a first housing width, that defines device housings having a second housing width that is smaller than the first housing width, and that is configured to coupled multiple devices to the rack in those device housings. For example, the multi-device rack-width-adapted rack system of the present disclosure may include a multi-device rack width adapter system mounted to a rack having first and second sides defining a rack housing having a first housing width. The multi-device rack width adapter system includes a first multi-device rack width adapter subsystem in the rack housing mounted to the first side of the rack, a second multi-device rack width adapter subsystem in the rack housing mounted to the second side of the rack, and pairs of device coupling elements that each include a first device coupling element on the first multi-device rack width adapter subsystem and a second device coupling element on the second multi-device rack width adapter subsystem. Each pair of device coupling elements may couple a respective second device to the rack in a second device housing defined by that pair of device coupling elements with a second housing width that is smaller than the first housing width. As such, multiple devices that are configured to mount to relatively smaller width racks may be quickly and easily coupled to relatively larger width racks.

Although illustrative embodiments have been shown and described, a wide range of modification, change and substitution is contemplated in the foregoing disclosure and in some instances, some features of the embodiments may be employed without a corresponding use of other features. Accordingly, it is appropriate that the appended claims be construed broadly and in a manner consistent with the scope of the embodiments disclosed herein.

What is claimed is:

1. A multi-device rack-width-adapted rack system, comprising:
   a rack including a first side and a second side, wherein a rack housing having a first housing width is defined between the first side and the second side; and
   a multi-device rack width adapter system that is mounted to the rack, wherein the multi-device rack width adapter system includes:
      a first multi-device rack width adapter subsystem that is located in the rack housing and that is mounted to the first side of the rack;
      a second multi-device rack width adapter subsystem that is located in the rack housing and that is mounted to the second side of the rack; and
      a plurality of pairs of device coupling elements that each include a first device coupling element provided on the first multi-device rack width adapter subsystem and a second device coupling element provided on the second multi-device rack width adapter subsystem, wherein each pair of device coupling elements is configured to couple a respective device to the rack in a respective device housing that is defined between that pair of device coupling elements and that includes a second housing width that is smaller than the first housing width.

2. The multi-device rack-width-adapted rack system of claim 1, wherein the first housing width is approximately 21 inches.

3. The multi-device rack-width-adapted rack system of claim 1, wherein the second housing width is approximately 19 inches.

4. The multi-device rack-width-adapted rack system of claim 1, further comprising:
   a respective pair of adapter rails that are connected to each of the plurality of pairs of device coupling elements, wherein each respective pair of adapter rails is configured to engage a respective device to configure its connected pair of device coupling elements to couple that respective device to the rack, wherein each respective pair of adapter rails is separately removable from the pair of device coupling elements to which it is coupled.

5. The multi-device rack-width-adapted rack system of claim 1, further comprising:
   an adapter rail system that is connected to at least some of the plurality of pairs of device coupling elements, wherein the adapter rail system is configured to engage the respective devices to configure all of the pairs of device coupling elements to couple those respective devices to the rack.

6. The multi-device rack-width-adapted rack system of claim 1, further comprising:

an adapter rail system that is connected to at least some of the plurality of pairs of device coupling elements, wherein the adapter rail system is configured to engage a subset of the respective devices to configure a subset of the pairs of device coupling elements to couple that subset of respective devices to the rack.

7. A multi-device rack width adapter system, comprising:

a first multi-device rack width adapter subsystem that is configured to be mounted to a first side of a rack and positioned in a rack housing that includes a first housing width and that is defined between the first side of the rack and a second side of the rack;

a second multi-device rack width adapter subsystem that is configured to be mounted to the second side of the rack and positioned in the rack housing; and a plurality of pairs of device coupling elements that each include a first device coupling element provided on the first multi-device rack width adapter subsystem and a second device coupling element provided on the second multi-device rack width the subsystem, wherein each pair of device coupling elements is configured, when the first multi-device rack width adapter subsystem is mounted to the first side of a rack and the second multi-device rack width adapter subsystem is mounted to the second side of a rack, to couple a respective device to the rack in a respective device housing that is defined between that pair of device coupling elements and that includes a second housing width that is smaller than the first housing width.

8. The multi-device rack width adapter system of claim 7, wherein the first housing width is approximately 21 inches.

9. The multi-device rack width adapter system of claim 7, wherein the second housing width is approximately 19 inches.

10. The multi-device rack width adapter system of claim 7, further comprising:

a respective pair of adapter rails that are connected to each of the plurality of pairs of device coupling elements, wherein each respective pair of adapter rails is configured to engage a respective device to configure its connected pair of device coupling elements to couple that respective device to the rack, wherein each respective pair of adapter rails is separately removable from the pair of device coupling elements to which it is coupled.

11. The multi-device rack width adapter system of claim 7, further comprising:

an adapter rail system that is connected to at least some of the plurality of pairs of device coupling elements, wherein the adapter rail system is configured to engage the respective devices to configure all of the pairs of device coupling elements to couple those respective devices to the rack.

12. The multi-device rack width adapter system of claim 7, further comprising:

an adapter rail system that is connected to at least some of the plurality of pairs of device coupling elements, wherein the adapter rail system is configured to engage a subset of the respective devices to configure a subset of the pairs of device coupling elements to couple that subset of respective devices to the rack.

13. The multi-device rack width adapter system of claim 7, wherein the plurality of pairs of device coupling elements are provided by 10 pairs of device coupling elements that are configured, when the first rack width adapter subsystem is mounted to the first side of a rack and the second rack width adapter subsystem is mounted to the second side of a rack, to couple 10 devices to the rack.

14. A method for adapting a width of a rack to house devices, comprising:

mounting, by a first multi-device rack width adapter subsystem, to a first side of a rack and in a rack housing that includes a first housing width and that is defined between the first side of the rack and a second side of the rack;

mounting, by a second multi-device rack width adapter subsystem, to the second side of the rack and in the rack housing; and coupling, by each of a plurality of pairs of device coupling elements that each include a first device coupling element provided on the first multi-device rack width adapter subsystem and a second device coupling element provided on the second multi-device rack width the subsystem, a respective device to the rack in a respective device housing that is defined between that pair of device coupling elements and that includes a second housing width that is smaller than the first housing width.

15. The method of claim 14, wherein the first housing width is approximately 21 inches.

16. The method of claim 14, wherein the second housing width is approximately 19 inches.

17. The method of claim 14, further comprising:

engaging, by each of a respective pair of adapter rails that are connected to each of the plurality of pairs of device coupling elements, a respective device to configure its connected pair of device coupling elements to couple that respective device to the rack, wherein each respective pair of adapter rails is separately removable from the pair of device coupling elements to which it is coupled.

18. The method of claim 14, further comprising:

engaging, by an adapter rail system that is connected to at least some of the plurality of pairs of device coupling elements, the respective devices to configure all of the pairs of device coupling elements to couple those respective devices to the rack.

19. The method of claim 14, further comprising:

engaging, by an adapter rail system that is connected to at least some of the plurality of pairs of device coupling elements, a subset of the respective devices to configure a subset of the pairs of device coupling elements to couple that subset of respective devices to the rack.

20. The method of claim 14, wherein the plurality of pairs of device coupling elements are provided by 10 pairs of device coupling elements that couple 10 devices to the rack.

* * * * *